US006967373B2

(12) United States Patent
Choi

(10) Patent No.: US 6,967,373 B2
(45) Date of Patent: Nov. 22, 2005

(54) TWO-BIT CHARGE TRAP NONVOLATILE MEMORY DEVICE AND METHODS OF OPERATING AND FABRICATION THE SAME

(75) Inventor: Jeong-Hyuk Choi, Kyonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/358,413

(22) Filed: Feb. 4, 2003

(65) Prior Publication Data

US 2003/0193827 A1    Oct. 16, 2003

(30) Foreign Application Priority Data

Apr. 12, 2002  (KR) .............................. 2002-19949

(51) Int. Cl.[7] .......................................... H01L 29/792
(52) U.S. Cl. ...................... 257/321; 257/324; 257/317
(58) Field of Search ............................ 257/321, 317, 257/324, 315

(56) References Cited

U.S. PATENT DOCUMENTS

| | | | |
|---|---|---|---|
| 5,065,362 A | 11/1991 | Herdt et al. ................. | 365/154 |
| 5,210,047 A | 5/1993 | Woo et al. .................... | 437/43 |
| 5,227,326 A | 7/1993 | Walker ......................... | 437/52 |
| 6,011,725 A | 1/2000 | Eitan ...................... | 365/185.33 |
| 2001/0052615 A1 | 12/2001 | Fujiwara ..................... | 257/315 |

FOREIGN PATENT DOCUMENTS

| | | | | |
|---|---|---|---|---|
| WO | WO 01/84632 A1 | 11/2001 | ......... | H01L 27/115 |
| WO | WO 02/25733 A2 | 3/2002 | ........... | H01L 27/00 |

OTHER PUBLICATIONS

Geppert, L., "The New Indelible Memories", IEEE Spectrum, Mar. 2003, pp. 49-54.*
Eitan B, et al.:"NROM: A Novel Localized Trapping, 2-Bit Nonvolatile Memory Cell."In: IEEE Electron Device Letters, vol. 21, No. 11, Nov. 2000, S. 543-545.

* cited by examiner

Primary Examiner—Andrew Q. Tran
(74) Attorney, Agent, or Firm—Marger Johnson & McCollom, P.C.

(57) ABSTRACT

Two-bit programmable nonvolatile memory devices and methods of operating and fabricating the same are provided. The device comprises a plurality of device isolation layers, a plurality of word lines crossing over the device isolation layers, and a multiple insulation layer intervened between the word line and the active region. The multiple insulation layer includes a charge trap insulation layer. A source/drain region is formed at each region defined by adjacent word lines and the adjacent device isolation layers. The source/drain regions have the same surface area. A write operation of the device comprises applying a first level voltage, a ground voltage, and a write voltage to one bit line, another bit line, and a selected word line, thereby writing data into a charge trap insulation layer. By changing the voltages applied to the bit lines, 2 bits may be stored in one memory cell.

20 Claims, 29 Drawing Sheets

TWO-BIT CHARGE TRAP NONVOLATILE MEMORY DEVICE AND METHODS OF OPERATING AND FABRICATION THE SAME

RELATED APPLICATION

This application relies for priority upon Korean Patent Application No. 2002-19949, filed on Apr. 12, 2002, the contents of which are herein incorporated by reference in their entirety.

FIELD OF THE INVENTION

The present invention relates to semiconductor devices and methods of fabricating the same. More specifically, the present invention relates to floating trap type nonvolatile memory devices that have memory cell transistors substituting gate insulation layers of MOS transistors for charge trapping materials and are capable of storing a plurality of data in a single cell transistor, and methods of fabricating the same.

BACKGROUND OF THE INVENTION

A floating trap type nonvolatile memory device has the same structure as a MOS transistor, and uses multiple insulation layers including a tunnel insulation layer, a charge trap insulation layer, and a blocking insulation layer for gate insulation. The charge trap insulation layer is normally a silicon nitride layer. In the floating trap type nonvolatile memory device, to store data, electrons are injected into the charge trap insulation layer using Fowler-Nordheim (F-N) tunneling or hot carrier injection. On the other hand, data are erased by emitting electrons from the charge trap insulation layer or by injecting holes into the charge trap insulation layer.

Referring to FIG. 1, the floating trap type memory device comprises a gate electrode 20 disposed on a semiconductor substrate, a stacked multiple insulation layer 18 intervened between the gate electrode 20 and the semiconductor substrate 2, and source and drain regions 6 and 4 (respectively) formed in the semiconductor substrate of both sides of the gate electrode 20. The multiple insulation layer 18 includes a tunnel insulation layer 12, a charge trap insulation layer 14, and a blocking insulation layer 16, which are sequentially stacked. In a SONOS memory device that is a typical floating trap type memory device, the tunnel insulation layer 12 and the blocking insulation layer 16 are silicon oxide layers, and the charge trap insulation layer 14 is a silicon nitride layer. When a program voltage of about 10 to 20V is applied to the gate electrode 20, a ground voltage is applied to the source region 6, and a drain voltage of about 5 to 7V is applied to the drain region 4, hot carriers generated in the vicinity of the drain region are injected into the charge trap insulation 8 region of layer 14 adjacent to the drain region 4. As a result, a first bit is written.

FIGS. 2 and 3 are a top plan view and an equivalent circuit diagram, respectively, illustrating a nonvolatile memory device with a conventional NOR-type cell array structure.

Referring to FIG. 2, a cell array of a floating trap type nonvolatile memory device may have the same structure as a NOR-type cell array of a conventional nonvolatile memory device, such as a flash memory device. A typical NOR-type cell array structure includes a plurality of first active regions 28 disposed at a semiconductor substrate in parallel along an axis (vertical in FIG. 2) in one direction, and a plurality of second active regions 26 disposed in parallel along an axis (horizontal in FIG. 2) at right angles to that of the first active regions 28. Pairs of word lines wl are disposed between the second active regions 26 across the first active regions 28. A bit line plugs 24 is formed at the first active region 28 between a pair of the word lines wl. A plurality of bit lines bl crossing over the word lines wl are connected to the bit line plugs 24. A multiple insulation layer (18 of FIG. 1) is intervened between each word line wl and the first active region 28.

Referring to FIGS. 2 and 3, a typical NOR-type cell array includes a plurality of word lines wl disposed in parallel in one direction as well as a plurality of bit lines bl disposed at right angles to the word lines wl. A memory cell S1 is disposed in a region where the bit line bl and the word line wl cross each other. A drain of the memory cell S1 is connected to the bit line bl, a gate electrode is connected to the word line wl, and a source is grounded. Storing data in a selected memory cell S1 involves applying 5 to 7V to a selected bit line bl1 connected to the selected memory cell S1, then applying a voltage of 10 to 20V to a selected word line wl1. At this time, hot electrons generated in the vicinity of the drain of the selected memory cell S1 are injected into the charge trap insulation layer, thereby writing a first bit bl. With respect to the foregoing conventional NOR-type cell array, because the source and drain regions of the memory cell have an asymmetric structure, it is difficult to form a 2-bit programmable memory cell due to differences in capacitance and resistance between the source and drain regions. Accordingly, the conventional NOR-type cell array may store only 1 bit in each memory cell S1.

Recently, multi-bit memory cells have been proposed to form high-capacity memory devices without increasing physical dimensions. Most of multi-bit memory cells use a multi-level threshold voltage storing two or more bits for each threshold voltage representing a different data state. However, a transformation of the multi-bit memory cell, in which each bit is stored in both sides of the charge trap insulation layer of the floating trap type memory cell, is disclosed in the technical article entitled "A Novel Localized Trapping, 2-Bit Nonvolatile Memory Cell" by Boaz Eitan, Paolo Pavan, Ilan Bloom, Efraim Aloni, Aviv Frommer, and David Finzi, IEEE Electron Device Letters, Vol. 21 November 2000.

Unlike a nonvolatile memory device with a floating gate, such as a flash memory device, the floating trap type memory device may have a plurality of data storing regions in a charge trap insulation layer (14 of FIG. 1), because charges are injected into a trap zone of the charge trap insulation layer (14 of FIG. 1).

FIG. 4 is a top plan view illustrating a conventional 2-bit programmable nonvolatile memory device.

FIG. 5 is an equivalent circuit diagram of the nonvolatile memory device of FIG. 4.

Referring to FIGS. 4 and 5, the conventional nonvolatile memory device comprises a plurality of parallel bit lines bl disposed in a semiconductor substrate at regular intervals. The bit lines bl are impurity diffused regions formed by injecting impurities into the semiconductor substrate. A plurality of parallel word lines wl cross over the bit lines bl at a right angle there to. Metal interconnections 36 for applying external voltages to each of the bit lines bl are connected through bit line plugs 34. Although not shown in the drawings, a multiple insulation layer (18 of FIG. 1) including a charge trap insulation layer is intervened between each of the word lines wl and the semiconductor substrate.

In the cell array, a pair of adjacent bit lines b1 and one word line w1 crossing a pair of the bit lines b1 constitute a memory cell S2. A pair of bit lines, i.e., first and second bit lines b11 and b12, and one word line w11 are selected to select a memory cell S2. To write a first bit b1, a voltage of 10 to 20V is applied to the selected word line wl, a voltage of 5 to 7V is applied to the first bit line b1, and a ground voltage is applied to the second bit line b2. At this time, hot electrons are generated in the vicinity of the first bit line b1, and the hot electrons are injected into a trap zone of the charge trap insulation layer. As a result, a first bit b1 is written. Likewise, a voltage of 10 to 20V is applied to the selected word line wl1, a voltage of 5 to 7V is applied to the second bit line bl2, and a ground voltage is applied to the first bit line bl1, thereby writing a second bit (b2). Consequently, the first and second bits b1 and b2, i.e., 2 bits are stored in one memory cell. While storing the first and second bits b1 and b2 are stored, other word lines wland other bit lines b1 are floated.

A read operation for reading out the first bit b1 comprises applying 3V to the selected word line wl1, applying a ground voltage to the first bit line bl1, and applying a voltage of 1 to 2V to the second bit line bl2. The second bit 2 is read out by applying 3V to the selected word line wl1, applying a ground voltage to the second bit line bl2, and applying a voltage of 1 to 2V to the first bit line bl1.

As illustrated in FIGS. 4 and 5, the conventional 2-bit programmable nonvolatile memory device includes a bit line made of a diffused layer. Accordingly, when a voltage of 1 to 2V is applied to a selected bit line in order to read out a written bit, a long charging time is required for elevating a bit line voltage.

SUMMARY OF THE INVENTION

It is therefore a feature of the present invention to provide nonvolatile semiconductor devices in which 2 bits may be stored in one memory cell and methods of operating and fabricating the same.

It is another feature of the present invention to provide 2-bit programmable nonvolatile memory devices capable of operating at high speed and methods of operating and fabricating the same.

In accordance with an aspect of the present invention, provided is a nonvolatile semiconductor device with source/drain regions of the same area. The device comprises a plurality of device isolation layers disposed at a predetermined region of a semiconductor substrate in parallel at regular intervals for defining active regions. A plurality of word lines cross over the device isolation layers also disposed in parallel at regular intervals. A multiple insulation layer is intervened between the word lines and the active region. The multiple insulation layer includes a charge trap insulation layer. A source/drain region is formed in each of the regions defined by a pair of adjacent word lines and the adjacent device isolation layers intersected by a pair of the adjacent word lines. The source/drain regions formed in the semiconductor substrate have the same area.

According to a first preferred embodiment of the present invention, each of the source/drain regions is connected to a bit line. The bit lines perpendicularly cross the word lines disposed in parallel and, in a cross-sectional view that is vertical to the direction of the word line, a pair of source/drain regions disposed at both sides of the word line are connected to different bit lines. Also, the charge trap insulation layer may be a silicon nitride layer, and the multiple insulation layer includes silicon oxide layers formed on and under the charge trap insulation layer.

In accordance with another aspect of the present invention, provided is a method of operating the foregoing nonvolatile memory device. The method of operating the device comprises write and read operations. To begin with, the write operation includes selecting any pair of adjacent bit lines, i.e., first and second bit lines as well as a word line, and then applying a first level voltage, a ground voltage, and a write voltage to the first and second bit lines and the selected word line, respectively, thereby writing a first bit into a region adjacent to the first bit line of the charge trap insulation layer constituting the selected memory cell.

Similarly, a first level voltage, a ground voltage, and a write voltage are applied to the second and first bit lines and the selected word line, respectively, thereby writing a second bit into a region adjacent to the second bit line of the charge trap insulation layer. The read operation of the device includes applying a ground voltage, a second level voltage lower than the first level voltage, and a read voltage lower than the write voltage to the first and second bit lines and the selected word line to read out a first bit, and then applying a ground voltage, a second level voltage, and a read voltage to the second and first bit lines and the selected word line to read out a second bit.

In accordance with still another aspect of the present invention, provided is a method of fabricating the nonvolatile memory device with the source/drain regions of the same area. The method comprises forming a plurality of device isolation layers at a predetermined region of a semiconductor substrate at regular intervals to define active regions. A multiple insulation layer and a gate conductive layer are sequentially stacked on an entire surface of the semiconductor substrate where the device isolation layers are formed.

The gate conductive layer and the multiple insulation layer are successively patterned to form a plurality of word lines crossing the device isolation layers at regular intervals. The word lines and the device isolation layers cross each other to form a plurality of isolated regions where the semiconductor substrate is exposed. Impurities are doped into the semiconductor substrate of the isolated region, thereby forming a plurality of source/drain regions arranged in the row and column directions. The multiple insulation layer may include one or more charge trap insulation layers. The charge trap insulation layer may be a silicon nitride layer. Also, the multiple insulation layer may include silicon oxide layers formed on and under the charge trap insulation layer.

BRIEF DESCRIPTION OF THE DRAWINGS

FIGS. 12A to 15A are top plan views illustrating a method of fabricating the nonvolatile memory device according to the first preferred embodiment of the present invention.

FIGS. 12B to 15B are cross-sectional views illustrating the method of fabricating the nonvolatile memory device according to the first preferred embodiment of the present invention, the cross-sectional views taken along the line V–V' of FIGS. 12A to 15A, respectively.

FIGS. 18A to 21A are top plan views illustrating a method of fabricating the nonvolatile memory device according to the second preferred embodiment of the present invention.

FIGS. 18B to 21B are cross-sectional views illustrating the method of fabricating the nonvolatile memory device according to the second preferred embodiment of the present invention, the cross-sectional views taken along the line VI–VI' of FIGS. 18A to 21A, respectively.

DESCRIPTION OF THE PREFERRED EMBODIMENT

Figure 1:
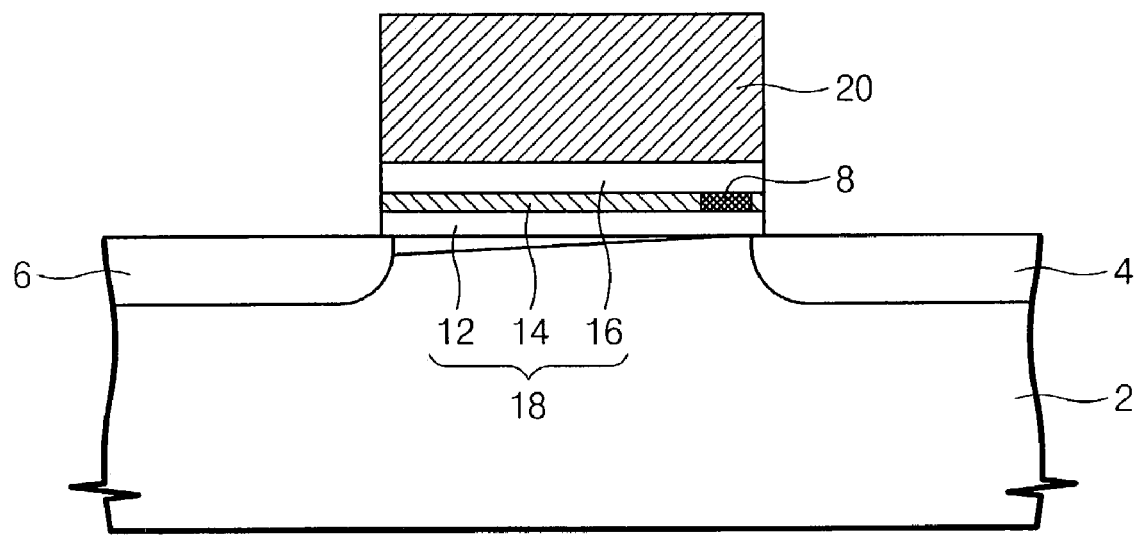
FIG. 1 is a cross-sectional view of a typical floating trap type nonvolatile memory device.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Referring to FIGS. 6 to 10, first device isolation layers 52 are disposed at a predetermined region of a semiconductor substrate 50. The first device isolation layers 52 are disposed at a predetermined pitch in the row and column directions. Second device isolation layers 53 are disposed at positions re-moved from the first device isolation layers 52 by one-half such the same pitch but in pitch in the row and column directions. The first and second device isolation layers 52 and 53 define active regions 54. The first and second device isolation layers 52 and 53 have the same shape. With respect to the first and second device isolation layers 52 and 53, a width in the row direction is preferably narrower than that in the column direction, and the pitch in the row direction of the first device isolation layers 52 is preferably more than two times a width in the row direction of the device isolation layers themselves.

A plurality of word lines wl cross over the first and second device isolation layers 52 and 53 in the row direction and are disposed at regular intervals. Each word line wl alternately crosses over the first and second device isolation layers 52 and 53. Also, a pair of word lines wl cross over each of first and second device isolation layers 52 and 53. A first source/drain region 64 is formed at each region defined by the adjacent first device isolation layers 52 and the word lines wl crossing over the first device isolation layers 52. Likewise, a second source/drain region 65 is formed at each region defined by the adjacent second device isolation layers 53 and the word lines wl crossing over the second device isolation layers 53. A multiple insulation layer 62 (see FIGS. 8 and 9) is intervened between the word lines wl and the active region 54 (see FIG. 6). The multiple insulation layer 62 includes one or more charge trap insulation layers 58. For example, the charge trap insulation layer 58 may be a silicon nitride layer. The multiple insulation layer 62 may include a tunnel insulation layer 56, a charge trap insulation layer 58, and a blocking insulation layer 60, which are sequentially stacked. The tunnel insulation layer 56 and the blocking insulation layer 60 may be silicon oxide layers, and the charge trap insulation layer 58 may be a silicon nitride layer.

Figure 9:
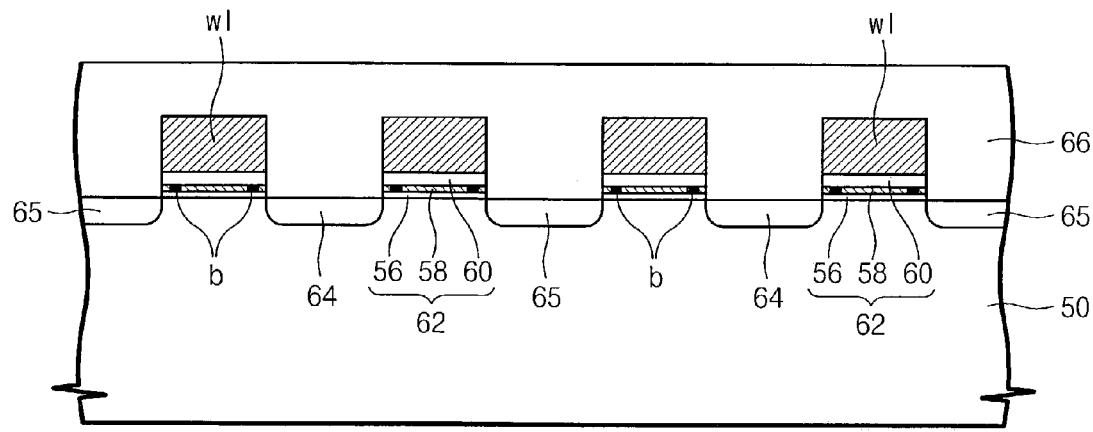
FIG. 9 is a cross-sectional view of the nonvolatile memory device according to the first preferred embodiment of the present invention, the cross-sectional view taken along the line III—III of FIG. 6.
Figure 10:
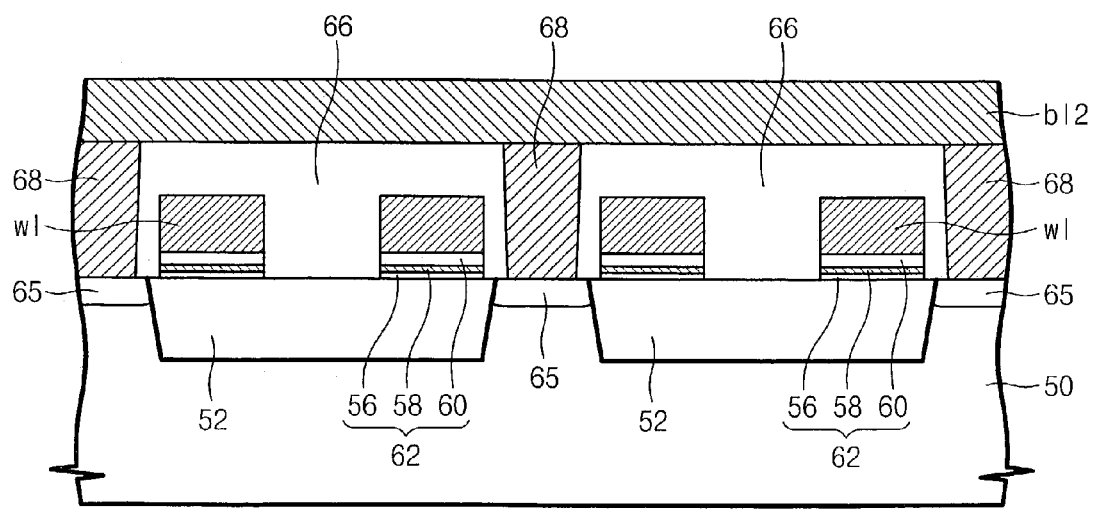
FIG. 10 is a cross-sectional view of the nonvolatile memory device according to the first preferred embodiment of the present invention, the cross-sectional view taken along the line IV–IV' of FIG. 6.

Refering briefly to FIG. 9, a data storing region b exists at each edge region of the charge trap insulation layer 58 that is adjacent to the first and second source/drain regions 64 and 65.

A bit line plug 68 (see FIGS. 7 and 10) is connected to each center of the first and second source/drain regions 64 and 65. The bit line plugs 68 penetrate an interlayer dielectric layer (ILD) 66 covering an entire surface of the semiconductor substrate. A plurality of first bit lines bl1 and a plurality of second bit lines bl2 cross over the word lines wl in the column direction (see FIG. 8). The first bit lines bl1 are connected to the first source/drain regions 64, and the second bit lines bl2 are connected to the second source/drain regions 65. The first and second bit lines bl1 and bl2 are alternately disposed at regular intervals. Each of the first and second bit lines bl1 and bl2 are connected to source/drain regions in the same column.

Figure 8:
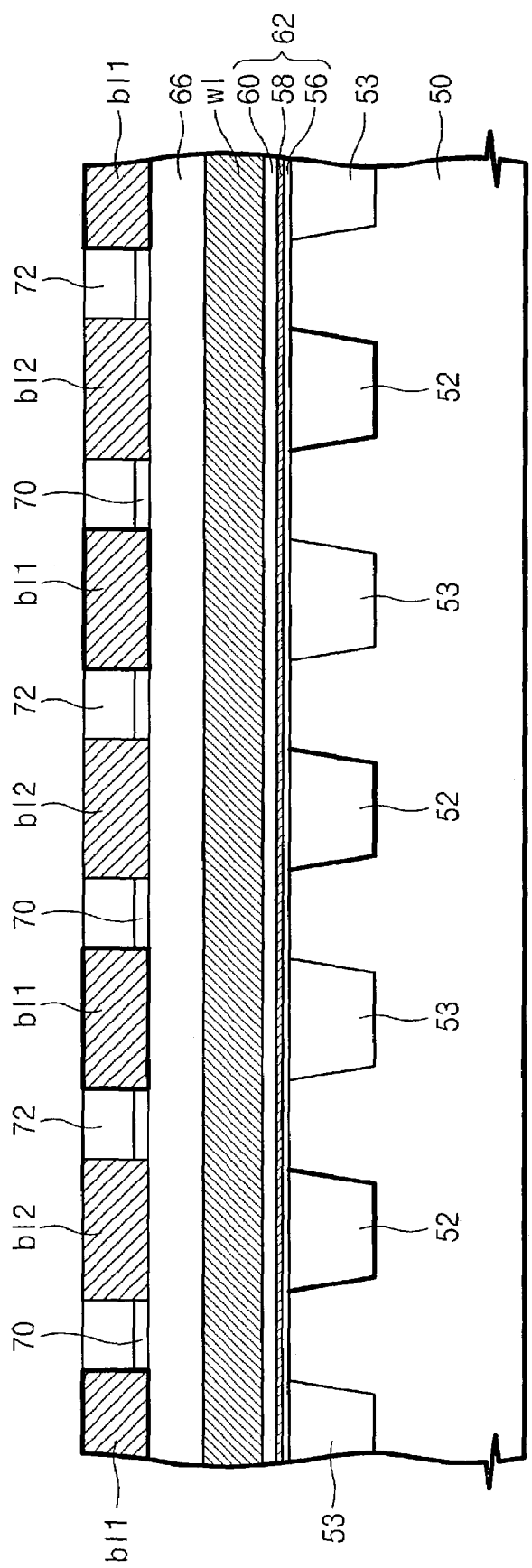
FIG. 8 is a cross-sectional view of the nonvolatile memory device according to the first preferred embodiment of the present invention, the cross-sectional view taken along the line II–II' of FIG. 6.

In case that bit lines are formed using a damascene process, the first and second bit lines bl1 and bl2 are insulated by a mold layer 72 formed of an insulation layer (see FIG. 8). The mold layer 72 may be composed of the same material as the ILD 66, and the mold layer 72 and the ILD 66 may be silicon oxide layers. While another insulation layer 70 is intervened between the mold layer 72 and the ILD 66, the another insulation layer 70 is an insulation layer having an etch selectivity with respect to the mold layer 72 and the ILD 66, for example, a silicon nitride layer. In case that the bit lines bl1 and bl2 are formed using conventional photolithography and etching processes, an inter metal dielectric layer (IMD) may be formed at a region between the bit lines bl1 and bl2.

Figure 11:
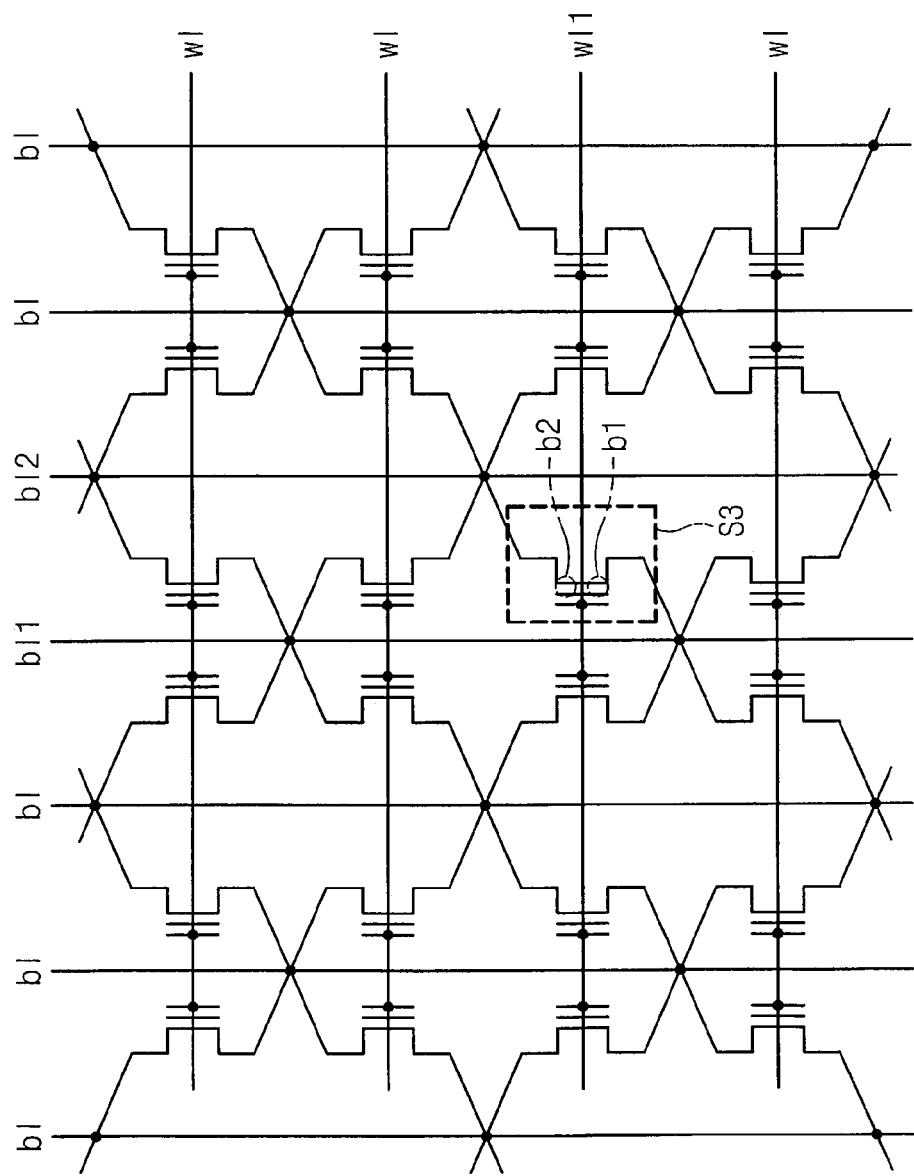
FIG. 11 is an equivalent circuit diagram illustrating a method of operating the nonvolatile memory device according to the first preferred embodiment of the present invention.

FIG. 11 is an equivalent circuit diagram illustrating a method of operating the nonvolatile memory device according to the first preferred embodiment of the present invention.

Referring to FIG. 11, a plurality of bit lines bl are disposed in one direction, and a plurality of word lines wl cross the bit lines bl at right angles. Memory cells in the same row are connected together through a word line. A pair of memory cells in a row and a pair of memory cells in another row share a source/drain region. That is, four adjacent memory cells have one source/drain region in common. Each bit line bl is connected to source/drain regions of the memory cells. Each memory cell has a pair of source/drain regions at both sides of a word line, and each source/drain region is connected to a different bit line. That is, a pair of adjacent bit lines are respectively connected to a pair of source/drain regions of a memory cell between a pair of the adjacent bitword lines.

In the present invention, a write operation of a memory cell includes selecting a pair of adjacent bit lines and one word line, thereby selecting one memory cell. For example, first and second bit lines bl1 and bl2 as well as a word line wl1 are selected to select a memory cell S3 (see FIG. 11). A program voltage of 10 to 20V is applied to the selected word line wl1, a voltage of 5 to 7V is applied to the first bit line bl1, and a ground voltage is applied to the second bit line bl2. The unselected other bit lines bl and word lines wl are floated. A ground voltage is applied to a semiconductor substrate. At this time, hot electrons generated in the vicinity of the first bit line bl1 are injected into a trap zone in the charge trap insulation layer (58 of FIG. 10) adjacent to the first bit line bl1, thereby writing a first bit b1'. Similarly, a program voltage of 10 to 20V is applied to the selected word line wl1, a voltage of 5 to 7 is applied to the second bit line bl2, and a ground voltage is applied to the first bit line bl1. As a result, a second bit b2' is written into the charge trap insulation layer (58 of FIG. 10) adjacent to the second bit line bl2. Thus, cell S3 is a multi-bit cell comprising bits B1' and B2'.

A read operation for reading out the first bit b1' includes applying a read voltage, which is lower than a threshold voltage of a memory cell of the write state and higher than a threshold voltage of the erase state, to the selected word line wl. In the embodiments of the present invention, a read voltage of 3V is applied. Also, a ground voltage is applied to the first bit line bl1, and a voltage of 1 to 2V is applied to the second bit line bl2. At this time, because a channel is formed under the first bit bl1, while a cell current does not flow in the write state, a cell current flows in the erase state. By using the cell current, data are read out. Likewise, a read voltage is applied to the selected word line wl1, a voltage of 1 to 2V is applied to the first bit line bl1, and a ground voltage is applied to the second bit line bl2, thereby reading out a second bit b2'.

As described above, the nonvolatile memory device of the present invention includes each memory cell with source/drain regions of the same shape, as well as a storing region where one bit is stored in each charge trap insulation layer adjacent to the source/drain region. In addition, unlike a conventional 2-bit programmable nonvolatile memory device, the nonvolatile memory device of the present invention includes a diffused layer of small surface area, which four adjacent cells have in common. Accordingly, because the nonvolatile memory device of the present invention has low resistance and low capacitance, the read operation may be performed at high speed.

Figure 12A:
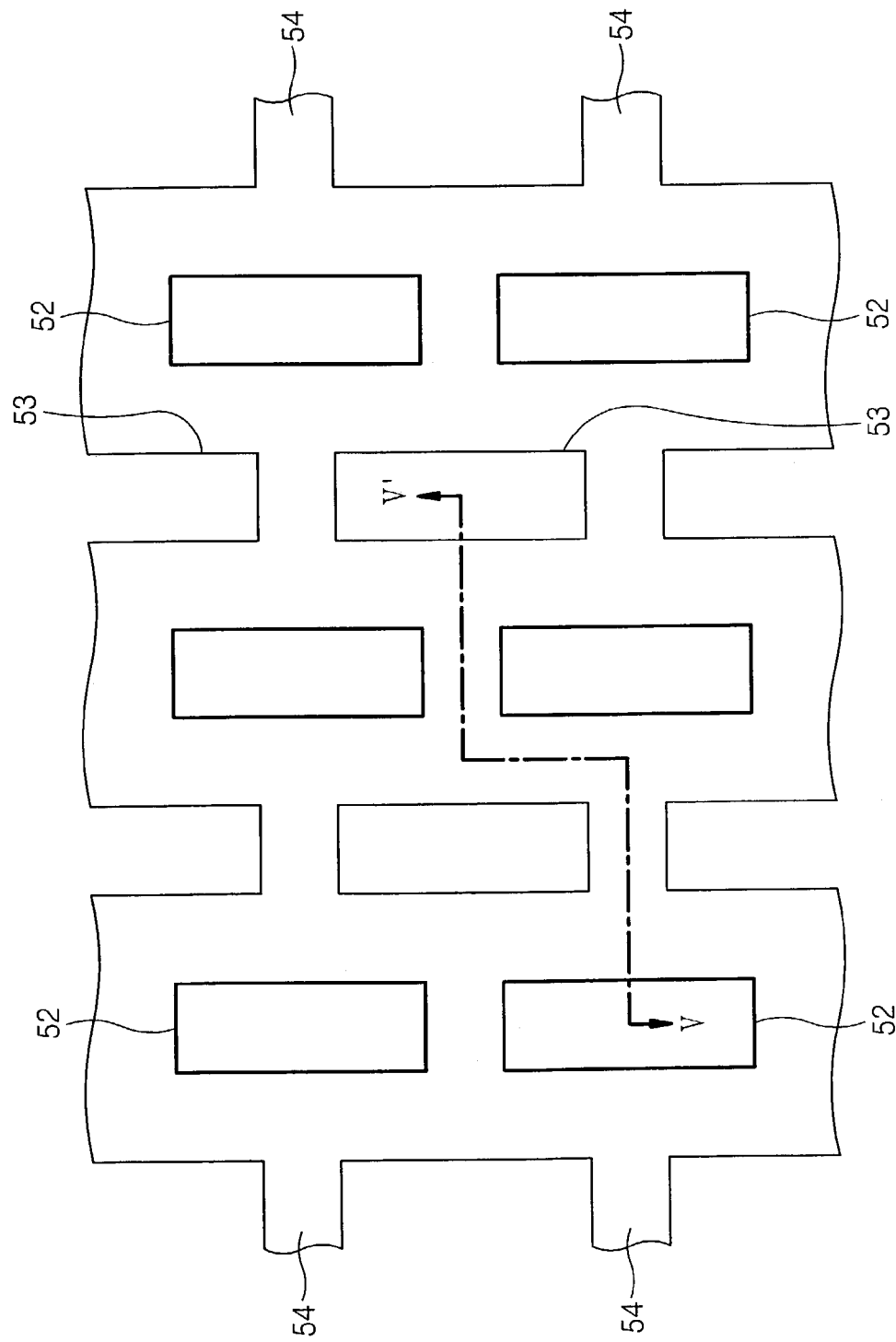
Figure 12B:
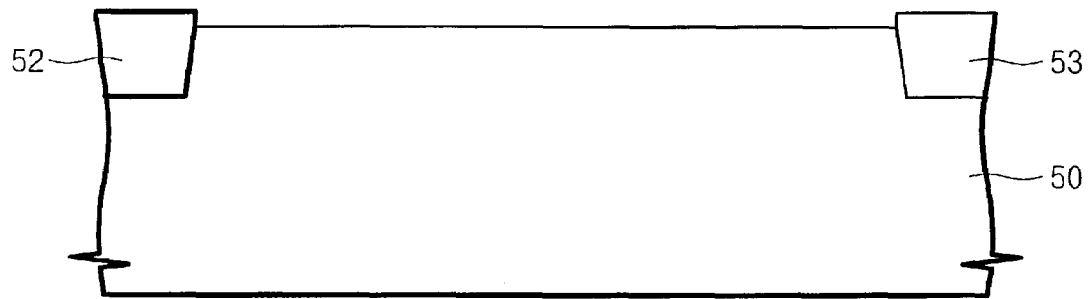

Referring to FIGS. 12A to 12B, first device isolation layers 52 are formed at regular pitches in a predetermined region of a semiconductor substrate 50 in the row and column directions. Then, second device isolation layers 53 are formed at positions re-moved from the first device isolation layers 52 by one-half such pitch in the row and column directions. The first and second device isolation layers 52 and 53 have the same shape, and a width in the column direction is wider than that in the row direction. The first device isolation layers are disposed such that a pitch in the row direction of each first device isolation layer 52 is more than two times a width in the row direction of the device isolation layer. The first and second device isolation layers 52 and 53 define active regions 54.

Figure 13A:
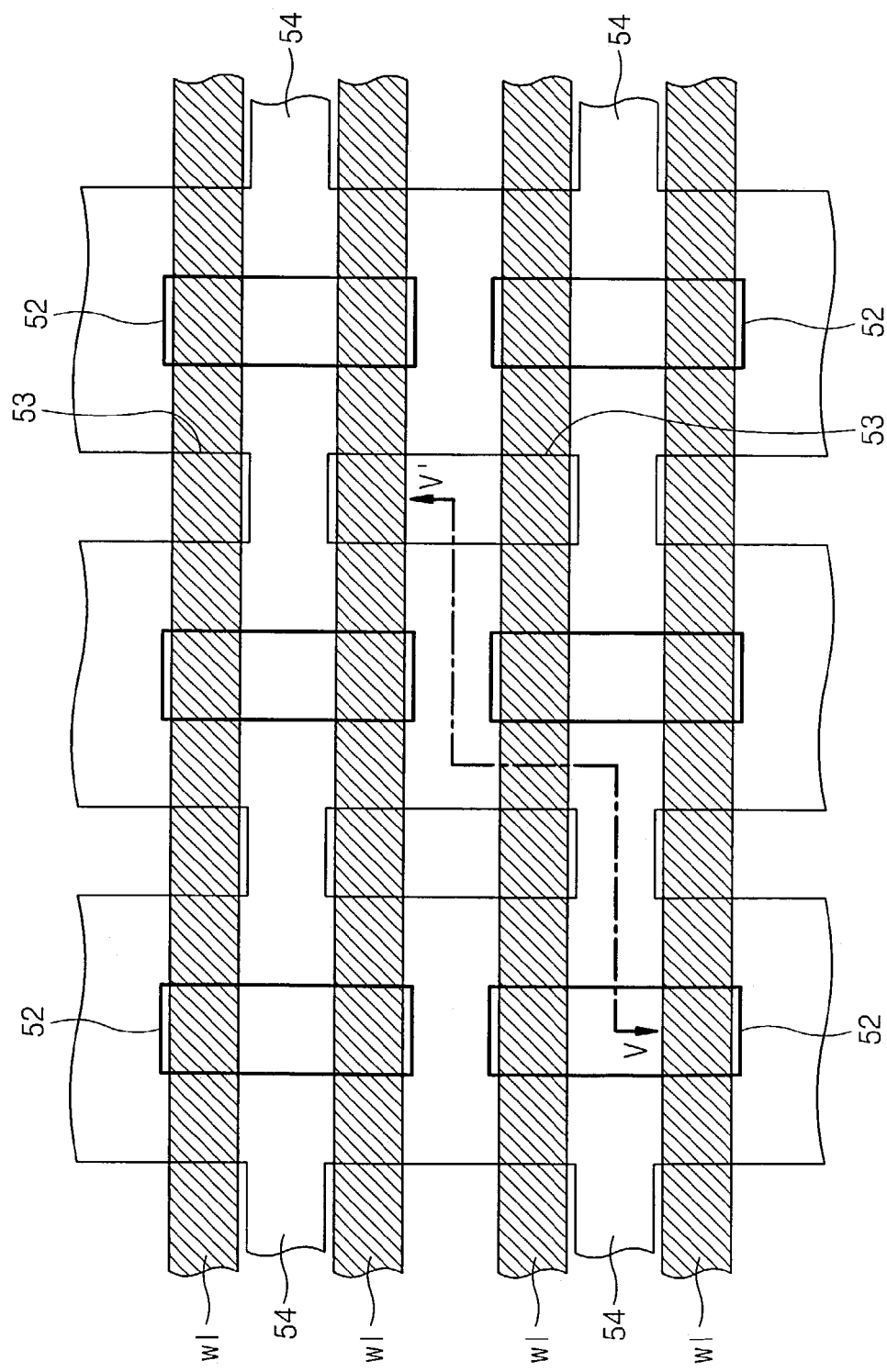
Figure 13B:
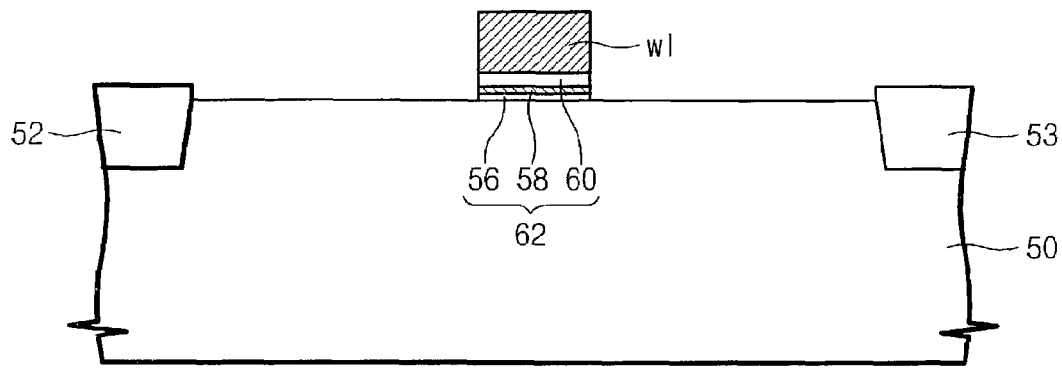

Referring to FIGS. 13A and 13B, a plurality of word lines wl are formed to cross over the first and second device isolation layers 52 and 53 in the row direction. The word lines wl may be formed by forming a multiple insulation layer and a gate conductive layer on an entire surface of the resultant structure where the first and second device isolation layers 52 and 53 are formed, then successively patterning the gate conductive layer and the multiple insulation layer. The multiple insulation layer 62 includes a tunnel insulation layer 56, a charge trap insulation layer 58, and a blocking insulation layer 60, which are sequentially stacked. Consequently, the multiple insulation layer is intervened between each word line wl and the active region 54. The tunnel insulation layer 56 and the blocking insulation layer 60 may be silicon oxide layers, and the charge trap insulation layer 58 may be a silicon nitride layer. The charge trap insulation layer 58 may be a multi-layered layer. The word lines wl are disposed in parallel at regular intervals. Also, a pair of word lines wl are disposed over each first and second device isolation layers 52 and 53. Each word line alternately crosses over the first and second device isolation layers 52 and 53.

Figure 14A:
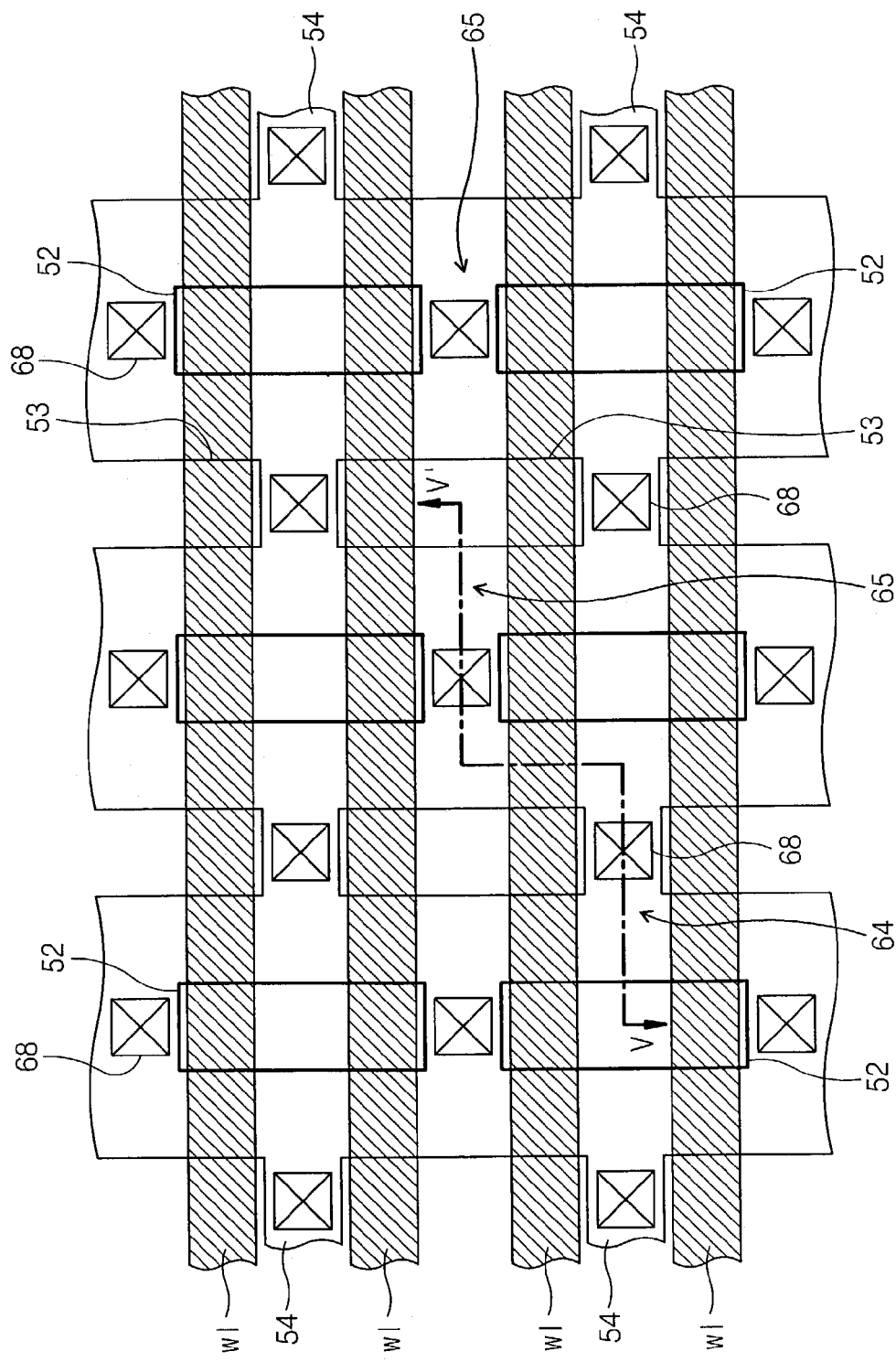
Figure 14B:
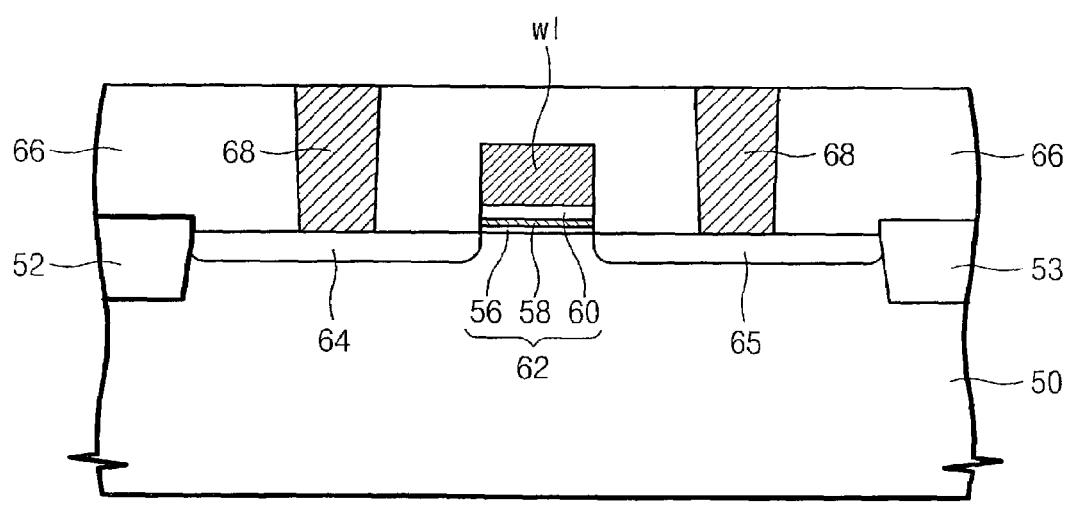

Referring to FIGS. 14A and 14B, impurities are doped into the active region 54 by using the word lines wl as an ion implantation mask. As a result, a first source/drain region 64 is formed in the active region, which is divided into the first device isolation layers 52 and the adjacent word lines wl. A second source/drain region 65 is formed in the active region, which is divided into the adjacent second device isolation layers 53 and the adjacent word lines wl. An ILD 66 is formed on an entire surface of the semiconductor substrate where the first and second source/drain regions 64 and 65 are formed. The ILD 66 may be a silicon oxide layer. A bit line plug 68 is formed to penetrate the ILD 66 such that the bit line plug 68 is connected to each of the first and second source/drain regions 64 and 65. Each bit line plug 68 is preferably formed to be positioned in the center of the first and second source/drain regions 64 and 65.

Figure 15A:
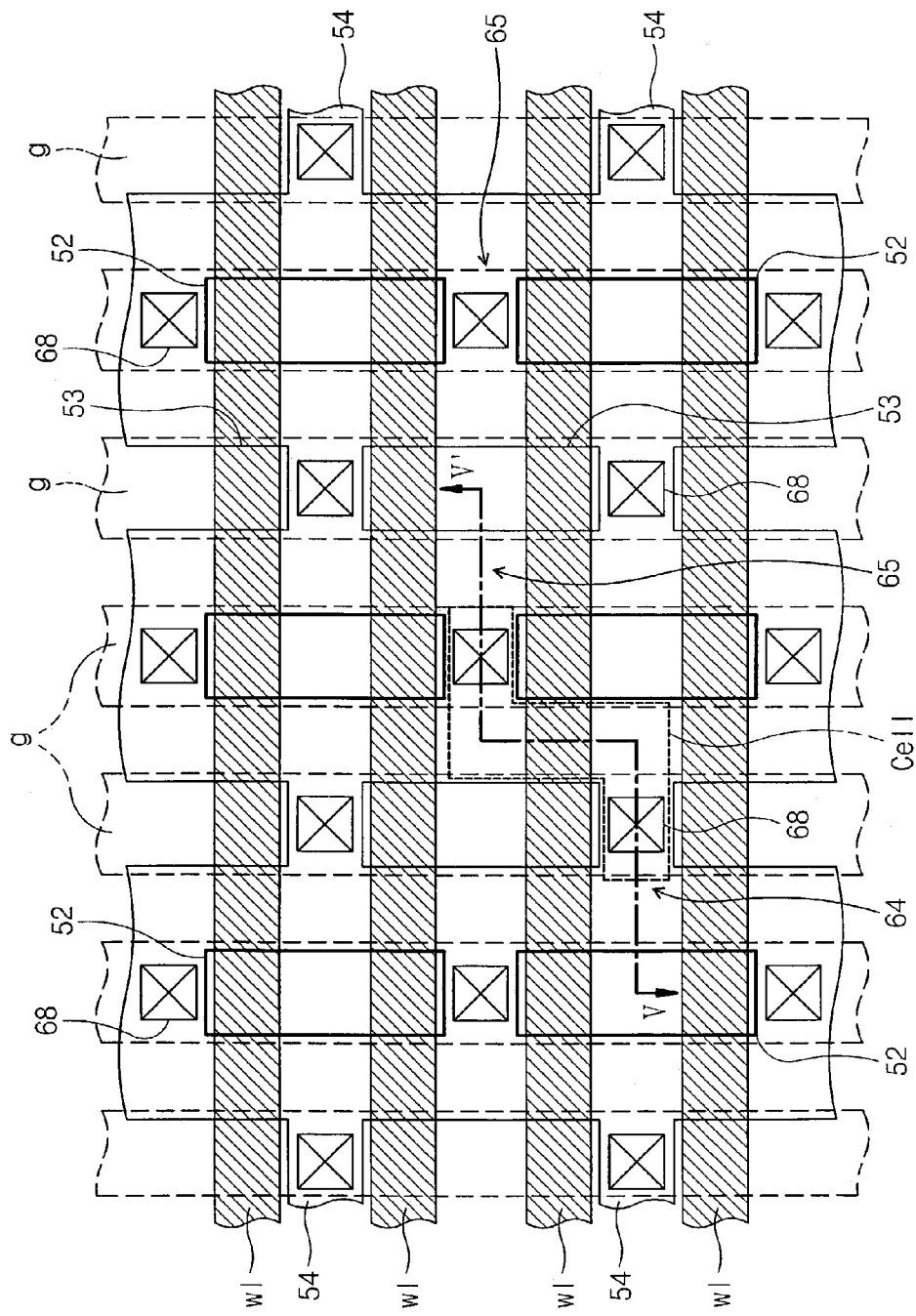
Figure 15B:
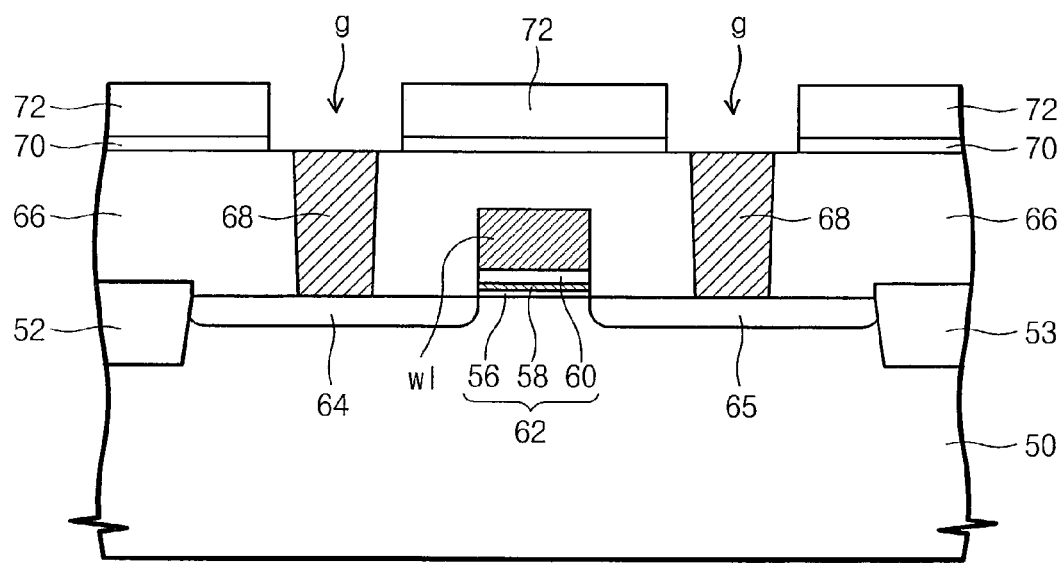

Referring to FIGS. 15A and 15B, an etch stop layer 70 is formed on the ILD 66, and a mold layer 72 is formed on the etch stop layer 70. The mold layer 72 and the etch stop layer 70 are successively patterned to form a plurality of grooves g that cross over the word lines wl and expose the bit line plugs 68. Continuously, although not shown in the drawings, a conductive layer is formed on an entire surface of the resultant structure where the grooves g are formed thereby to fill the insides of the grooves. The conductive layer is then polished by a chemical mechanical polishing (CMP) to expose the mold layer 72 and, at the same time, to form first and second bit lines bl1 and bl2 filling insides of the grooves.

Figure 16A:
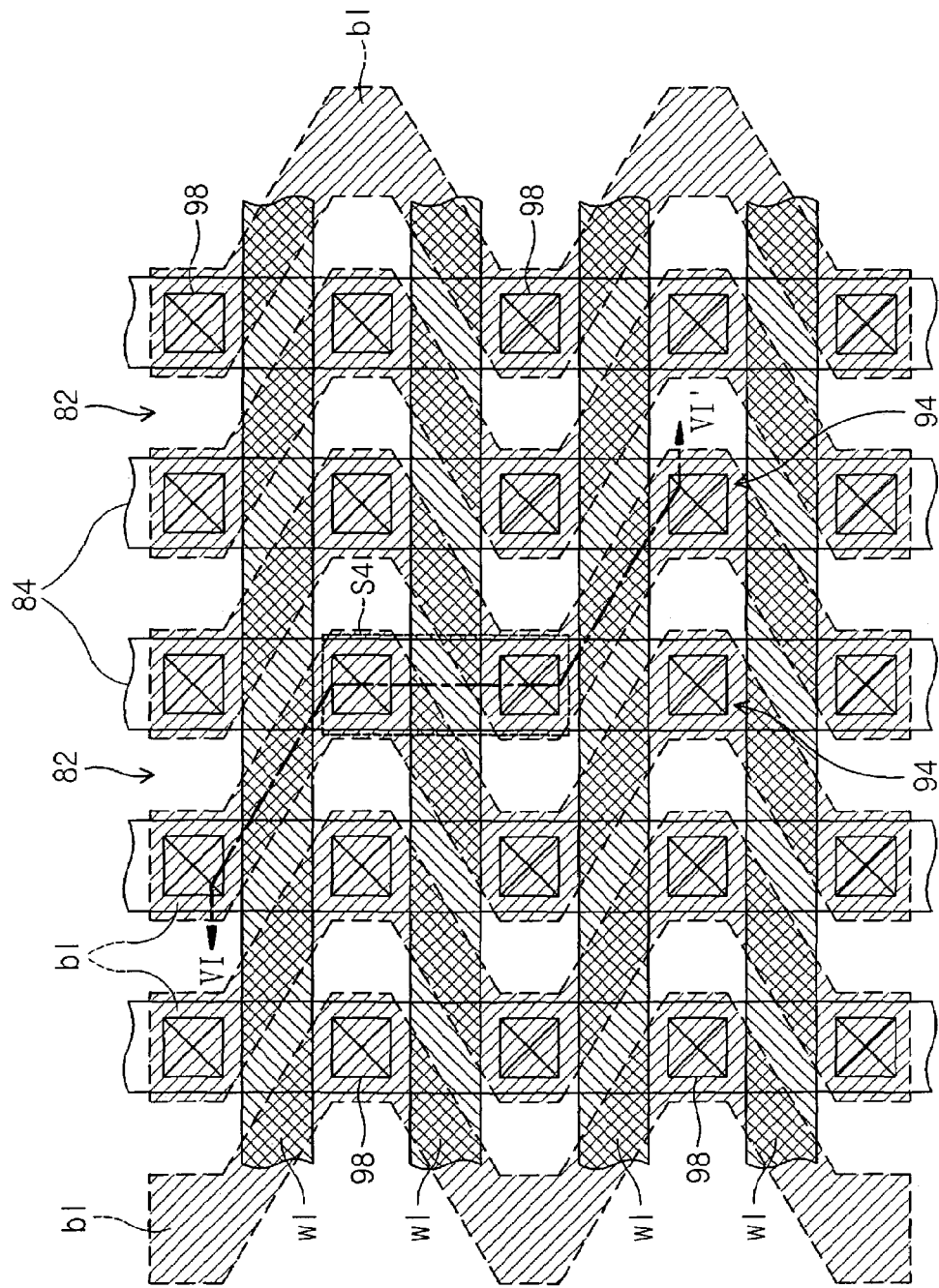
FIG. 16A is a top plan view illustrating a nonvolatile memory device according to a second preferred embodiment of the present invention.
Figure 16B:
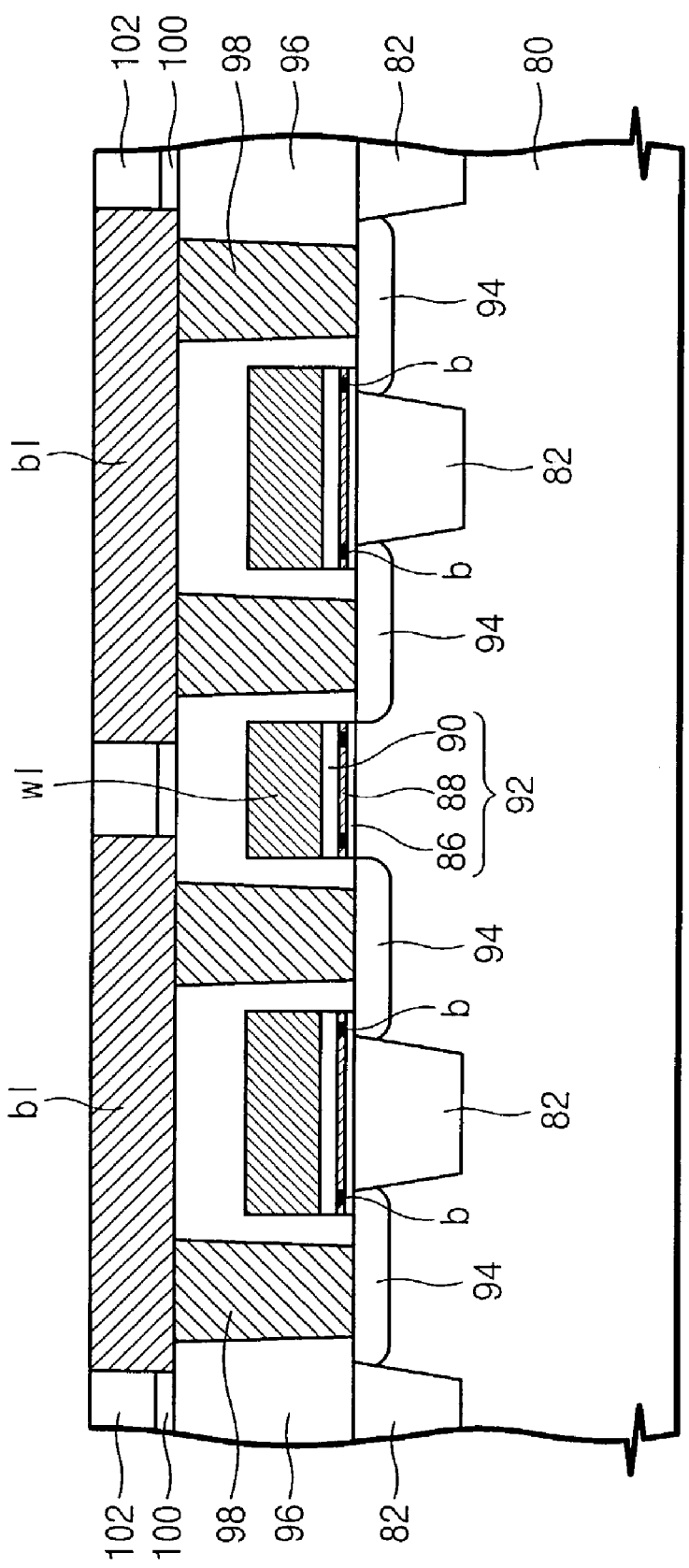
FIG. 16B is a cross-sectional view illustrating the non-volatile memory device according to the second preferred embodiment of the present invention, the cross-sectional view taken along the line VI–VI' of FIG. 16A.

Referring to FIGS. 16A and 16B, a patterned device isolation layer 82 forms predetermined isolation regions of a semiconductor substrate 96 to defining there around a plurality of active regions 84. The active regions are disposed in parallel at regular intervals. A plurality of word lines wl cross over the active regions 84 to be disposed in parallel at regular intervals. A multiple insulation layer 92 intervenes between each word line wl and the active region 84. The multiple insulation layer 92 includes a tunnel insulation layer 86, a charge trap insulation layer 88, and a blocking insulation layer 90, which are sequentially stacked. The tunnel insulation layer 86 and the blocking insulation layer 90 may be silicon oxide layers, and the charge trap insulation layer 88 may be a silicon nitride layer. The charge trap insulation layer 88 may have a multi-layered structure. A source/drain region 94 is formed in each of the active regions 84 of both sides of the word lines.

Because the word line wl and the active regions 84 are disposed at regular intervals, the source/drain regions 94 have the same area. Accordingly, the source/drain regions 94 have the same resistance and capacitance. A data storing region b exists at each edge region of the charge trap insulation layer 88 that is adjacent to the source/drain regions 94. A bit line plug 98 is connected to each source/drain region 94. An ILD 96 covers an entire surface of the semiconductor substrate 80, and the bit line plug 98 penetrates the ILD 96 to be connected to the source/drain region 94. Thus, the bit line plugs 98 are disposed at regular intervals in the row and column directions.

A plurality of bit lines bl connected to the bit line plugs 98 are disposed on the ILD 96. The bit lines bl cross over the word lines wl to be disposed at regular intervals. Each of the bit lines bl is alternately connected to two columns of adjacent source/drain regions 94. For example, when an nth bit line is connected to source/drain regions 94 of mth and m+1th columns, the nth bit line is connected to source/drain regions of odd-numbered rows of the mth column as well as to source/drain regions of even-numbered rows of the m+1th column. Consequently, with respect to each column of source/drain regions, odd-numbered source/drain regions are connected to one bit line, and even-numbered source/drain regions are connected to another bit line.

Accordingly, in a cross-sectional view crossing a word line wl, each of source/drain regions 94 of both sides of the word line wl are connected to an adjacent different bit line bl. The bit lines bl are insulated by an insulation layer. In case the bit lines bl are formed using a damascene process, the insulation layer includes an etch stop layer 100 and a mold layer 102, which are sequentially stacked.

Figure 17:
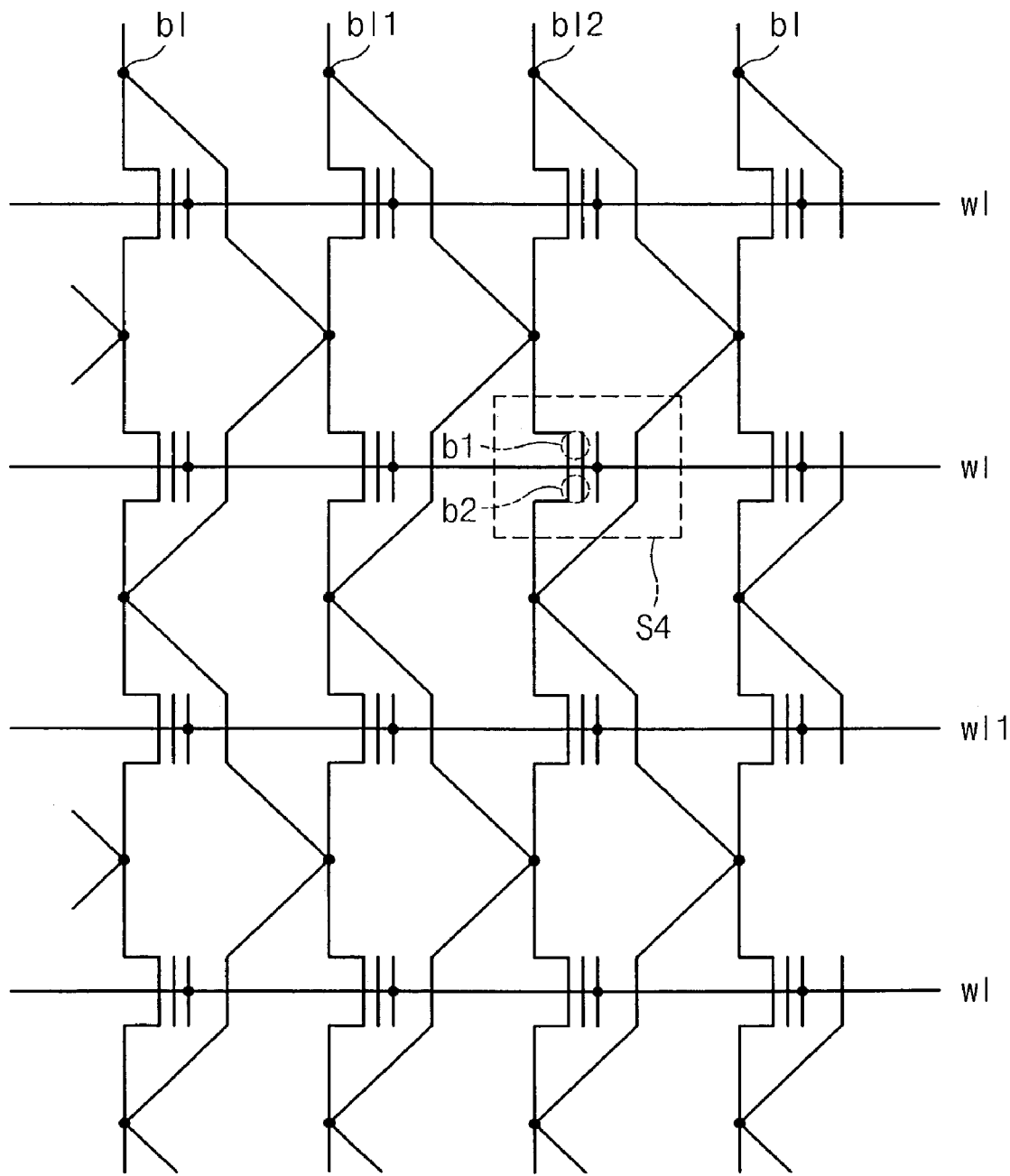
FIG. 17 is an equivalent circuit diagram illustrating a method of operating the nonvolatile memory device according to the second preferred embodiment of the present invention.

FIG. 17 is an equivalent circuit diagram illustrating a method of operating the nonvolatile memory device according to the second preferred embodiment of the present invention.

Referring to FIG. 17, a plurality of word lines wl are disposed in one direction, and a plurality of bit lines bl are disposed to cross the word lines wl. A plurality of memory cells are arranged in the row and column directions, i.e., in a matrix. Memory cells in the same row are connected together through a word line. Adjacent memory cells in the same column share a source/drain region. Odd-numbered memory cells of nth column and even-numbered memory cells of n+1th column are connected to one bit line. Even-numbered memory cells of nth column are connected to a different bit line from odd-numbered memory cells of n−1th column. Odd-numbered memory cells of n+1th column are connected to a still different bit line from even-numbered memory cells of n+2th column. In other words, a pair of source/drain regions included in each memory cell are respectively connected to an adjacent bit line bl.

Hereinafter, a write operation of a nonvolatile memory device according to a second preferred embodiment of the present invention will be described.

To begin with, first and second bit lines bl1 and bl2 as well as a word line wl1 are selected to select a memory cell S4 where a write operation will be performed. A program voltage of 10 to 20V is applied to the selected word line wl1, and a voltage of 5 to 7V is applied to the first bit line bl1, and a ground voltage is applied to the second bit line bl2. The unselected other bit lines bl and word lines wl are floated. A ground voltage is applied to a semiconductor substrate. At this time, hot electrons generated in the vicinity of the first bit line bl1 are injected into a trap zone in the charge trap insulation layer (88 of FIG. 16) adjacent to the first bit line bl1, thereby writing a first bit b1. Likewise, a program voltage of 10 to 20V is applied to the selected word line wl, a voltage of 5 to 7V is applied to the second bit line bl2, and a ground voltage is applied to the first bit line bl1. As a result, a second bit b2 is written into the charge trap insulation layer (88 of FIG. 16) adjacent to the second bit line bl2.

A read operation for reading out the first bit b1 comprises applying a read voltage that is lower than a threshold voltage of a memory cell of the write state and higher than a threshold voltage of a memory cell of the erase state. In the preferred embodiments of the present invention, a read voltage of 3V is applied. Also, a ground voltage is applied to the first bit line bl1, and a voltage of 1 to 2V is applied to the second bit line bl2. At this time, because a channel is formed under the first bit line bl1, a cell current does not flow in the write state but flows in the erase state. By using the cell current, data are read out. Similarly, a read voltage is applied to the selected word line wl1, a voltage of 1 to 2V is applied to the first bit line bl1, and a ground voltage is applied to the second bit line bl2, thereby reading out a second bit b2.

As described above, the nonvolatile memory device of the present invention includes memory cells, each of which has source/drain regions of the same shape, and a data storing region where one bit is stored in a charge trap insulation layer adjacent to each source/drain region. In addition, unlike a conventional 2-bit programmable nonvolatile memory device, the nonvolatile memory device of the present invention has an island-shaped source/drain region having a pair of adjacent memory cells in common. Accordingly, because source/drain regions have uniformly low resistance and capacitance, high-speed operations is possible.

Figure 18A:
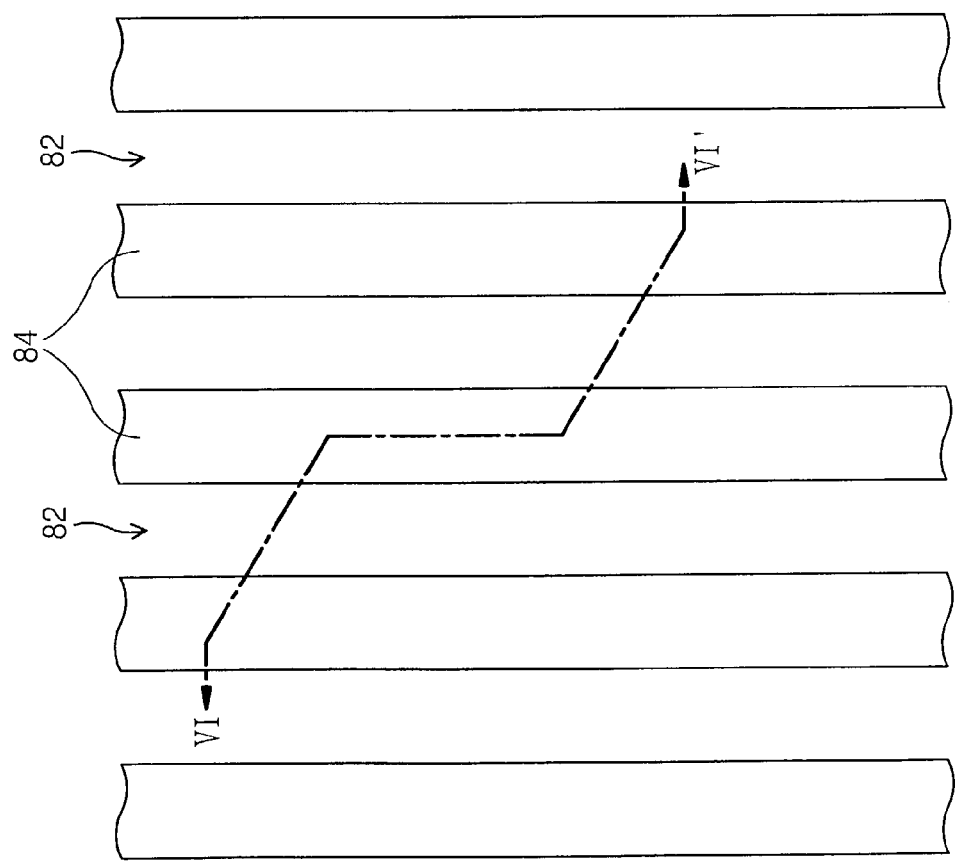
Figure 18B:
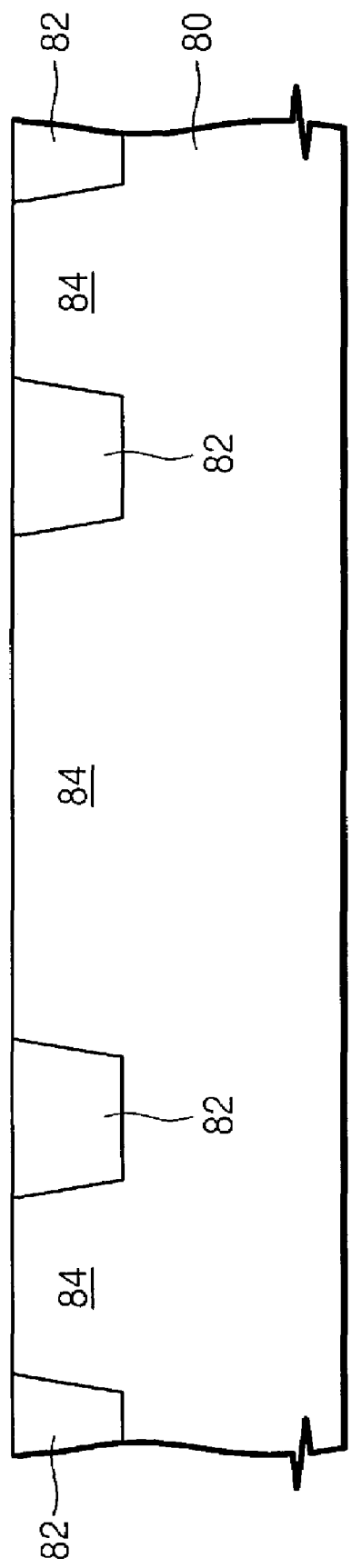

Referring to FIGS. 18A and 18B, a device isolation layer 82 is formed at a predetermined region of a semiconductor substrate 80, thereby defining a plurality of active regions 84. The active regions 84 are disposed at regular intervals.

Figure 19A:
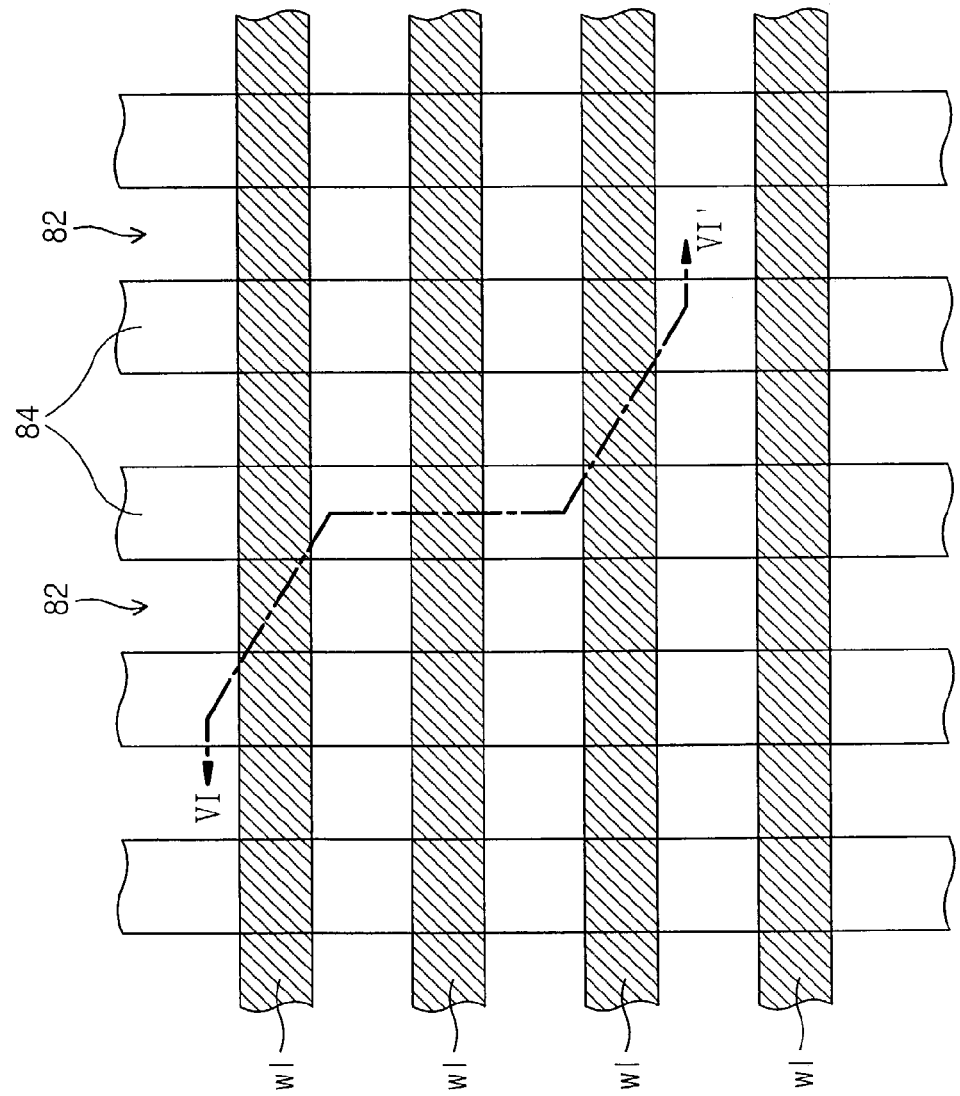
Figure 19B:
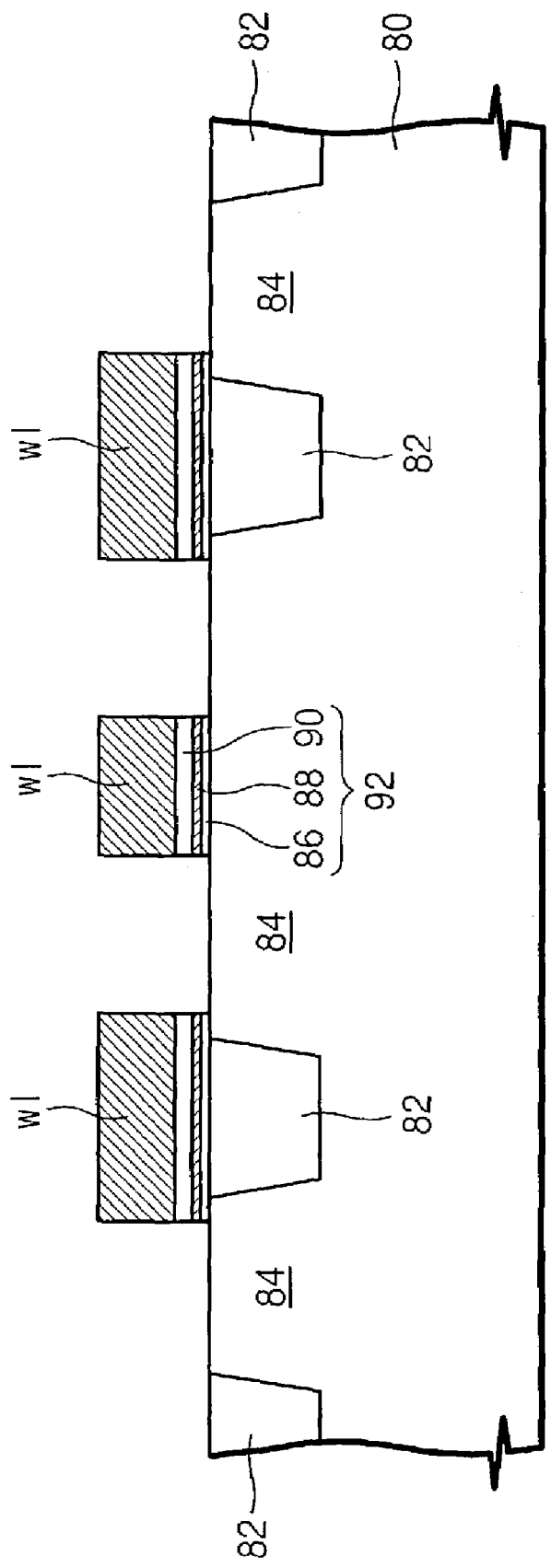

Referring to FIGS. 19A and 19B, a multiple insulation layer 92 and a gate conductive layer are sequentially formed on an entire surface of the semiconductor substrate 80. The gate conductive layer and the multiple insulation layer 92 are successively patterned to form a plurality of word lines wl crossing the active regions 84. The word lines wl are formed to be disposed in parallel at regular intervals. A multiple insulation layer 92 is intervened between each word line wl and the active region 84. The multiple insulation layer 92 may be formed by sequentially stacking a tunnel insulation layer 86, a charge trap insulation layer 88, and a blocking insulation layer 90. The tunnel insulation layer 86 and the blocking insulation layer 90 may be silicon oxide layers, and the charge trap insulation layer 88 may be a silicon nitride layer.

Figure 20A:
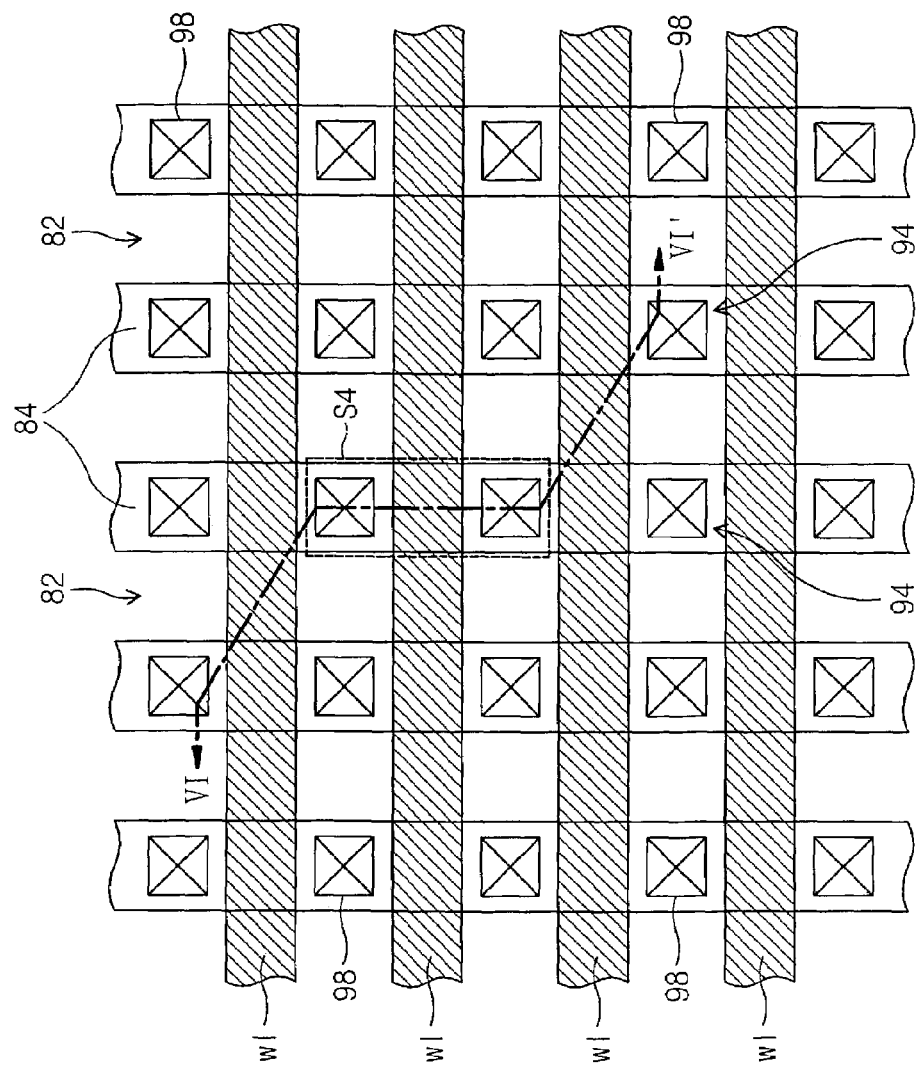
Figure 20B:
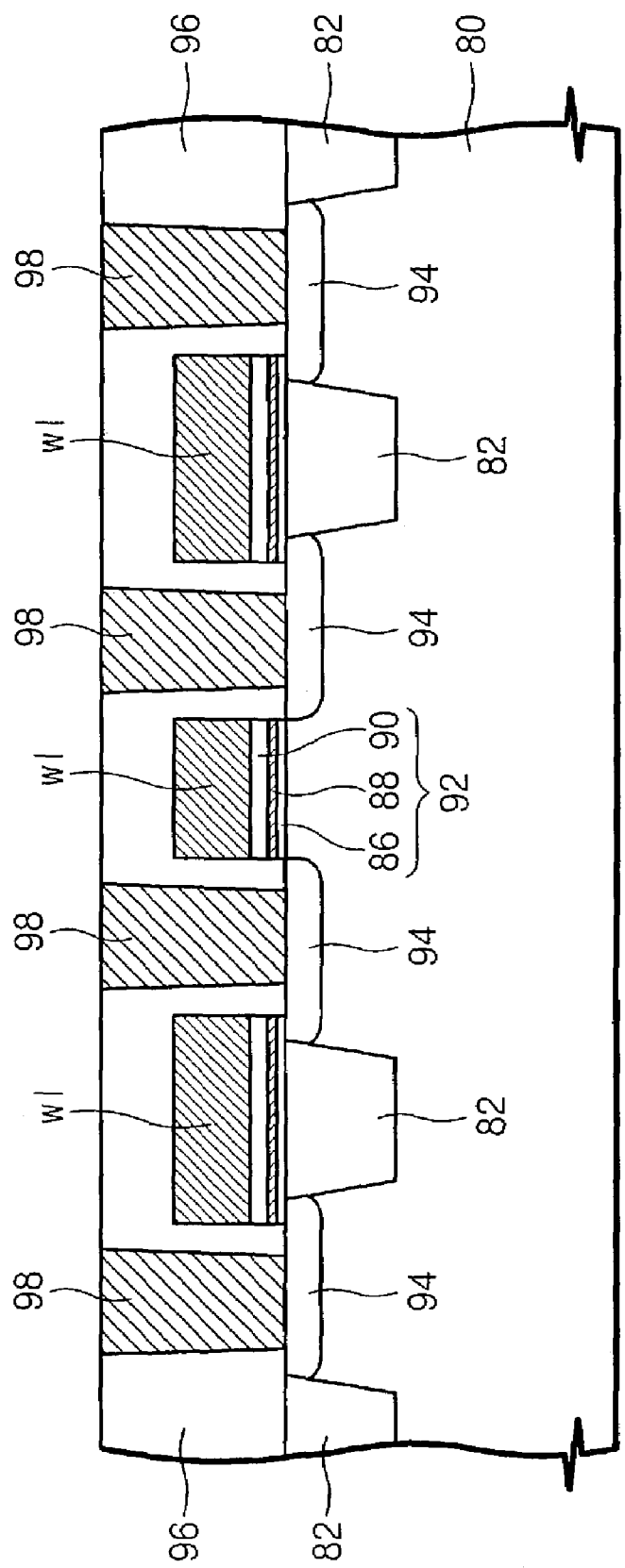

Referring to FIGS. 20A and 20B, by using the word lines wl as an ion implantation mask, impurities are doped into the active regions 84 to form a plurality of source/drain regions 94. The source/drain regions 94 are disposed in the semiconductor substrate 80 at predetermined intervals to the row and column directions, i.e., in a matrix. Continuously, an interlayer dielectric layer (ILD) 96 is formed on an entire surface of the semiconductor substrate 80. A bit line plug 98 penetrates the ILD 96 to be connected to each of the source/drain regions 94. As a result, bit line plugs 98 are formed on the semiconductor substrate 80 in a matrix.

Figure 21A:
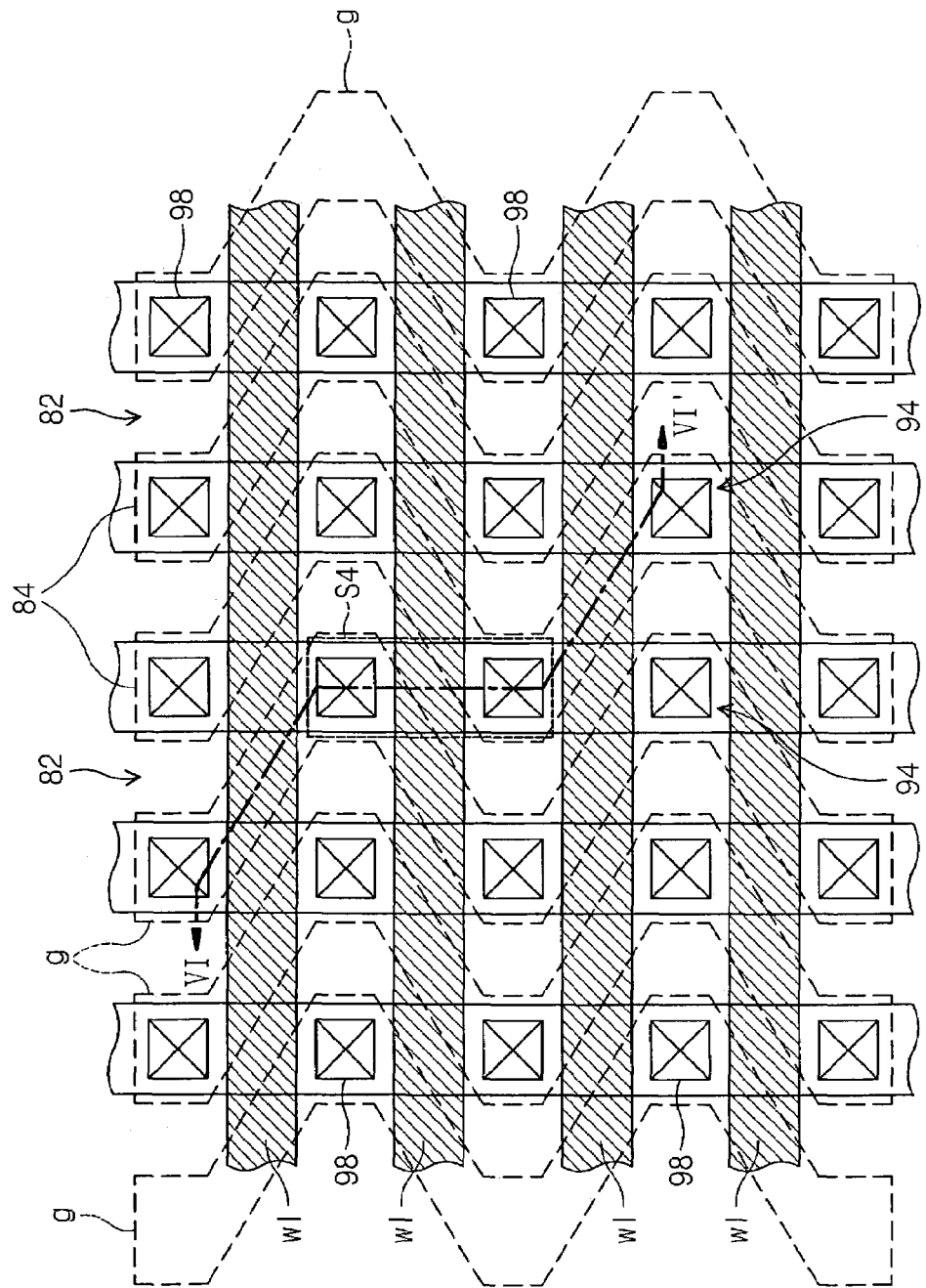
Figure 21B:
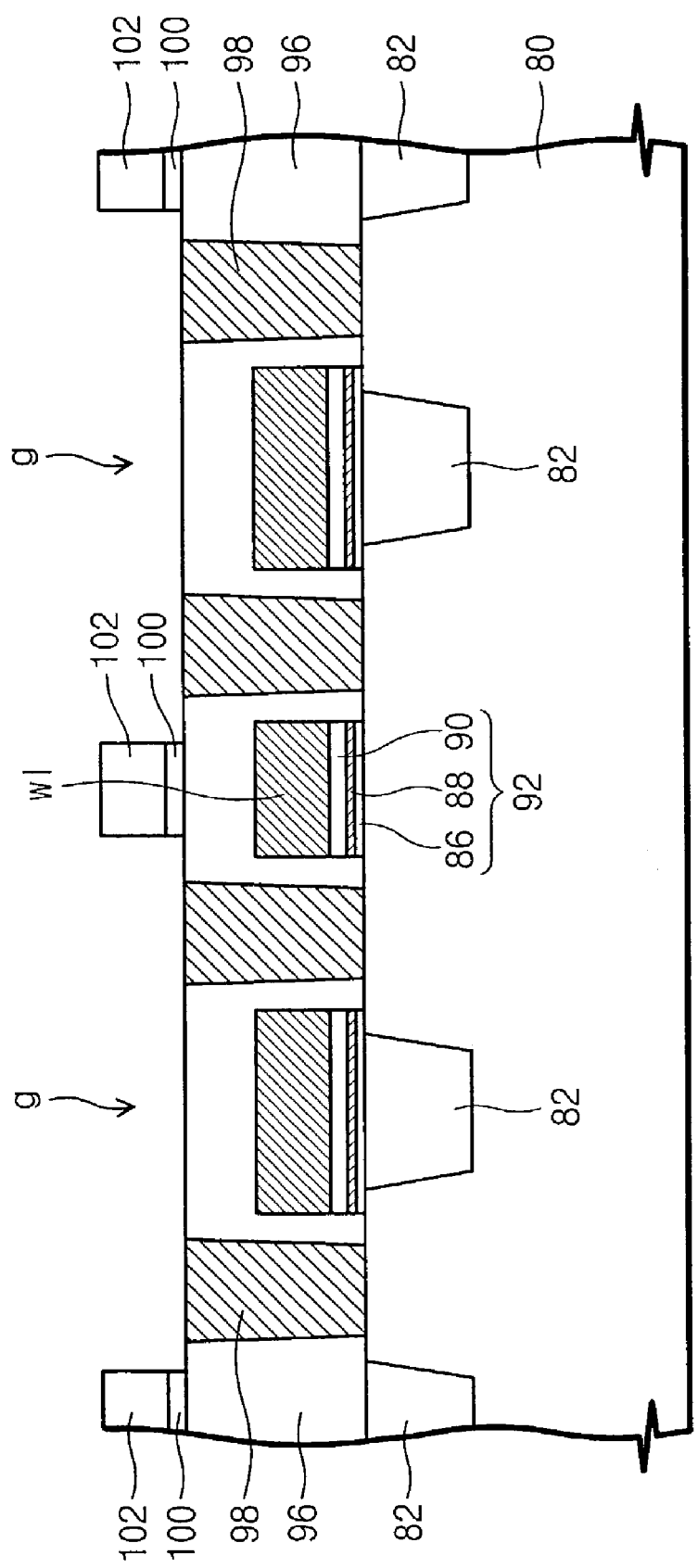

Referring to FIGS. 21A and 21B, an etch stop layer 100 and a mold layer 102 are sequentially formed on the ILD 96. The etch stop layer 100 is preferably composed of an insulation layer having an etch selectivity with respect to the ILD 96 and the mold layer 102. That is, the ILD 96 and the mold layer 102 may be silicon oxide layers, and the etch stop layer 100 may be a silicon nitride layer. The mold layer 102 and the etch stop layer 100 are successively patterned to form a plurality of grooves g crossing over the word lines wl. At this time, the grooves g are formed to alternately expose two columns of adjacent bit line plugs 98. Continuously, although not shown in the drawings, the grooves g are filled with a conductive layer; thereby forming a plurality of bit lines (bl of FIG. 16A) on the ILD 96. Each bit line bl is alternately connected to two columns of adjacent bit line plugs 8. That is, among bit line plugs 98 of a predetermined column, even-numbered bit line plugs 98 are connected to one bit line, and odd-numbered bit line plugs 98 are connected to another bit line adjacent to the bit line.

In another method, after forming a conductive layer, the bit lines bl may be formed using a conventional photolithography process.

As described above, according to the present invention, source/drain regions of a nonvolatile memory device are formed at a region defined by a pair of adjacent device isolation layers as well as a pair of adjacent word lines crossing the device isolation layers. Thus, the nonvolatile memory device may have relatively uniformly low resistance and capacitance. Also, each memory cell may have a pair of source/drain regions of the same resistance and capacitance. As a result, a read operation may be performed at high speed due to a high cell current. In addition, because each memory cell has symmetrical source/drain regions, 2-bit programmable nonvolatile memory cell can be provided under the same high-speed operating conditions.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A semiconductor memory device comprising:
   a plurality of device isolation regions disposed in a predetermined region of a semiconductor substrate, the device isolation regions defining active regions there between;
   a plurality of word lines crossing over the device isolation regions, the word lines disposed in parallel at regular intervals;
   a multiple insulation layer intervened between the word lines and the active regions, the multiple insulation layer including a charge trap insulation layer; and
   source/drain regions formed respectively at regions defined by a pair of adjacent word lines and by adjacent device isolation layers that the pair of the adjacent word lines intersects,
   wherein the source/drain regions formed in the semiconductor substrate have substantially the same surface area.

2. The device as claimed in claim 1, wherein a data storing region exists in the charge trap insulation layer adjacent to each of the source/drain regions.

3. The device as claimed in claim 1, wherein the multiple insulation layer comprises:
   a tunnel insulation layer formed on the semiconductor substrate;
   the charge trap insulation layer formed on the tunnel insulation layer; and
   a blocking insulation layer formed on the charge trap insulation layer.

4. The device as claimed in claim 1, wherein the charge trap insulation layer includes one or more silicon nitride layers.

5. The device as claimed in claim 1, further comprising a plurality of parallel bit lines connected respectively to the source/drain regions,
   wherein, two adjacent source/drain regions, each disposed at respective sides of one of the plurality of word lines, are connected to different bit lines.

6. The device as claimed in claim 1, wherein the source/drain regions have the same shape.

7. The device as claimed in claim 1, wherein each of the plurality of word lines, the multiple insulation layer, and two adjacent source/drain regions, each disposed at respective sides of one of the plurality of word lines, constitute a single memory cell, and
   wherein each of the two adjacent source/drain regions is in common with a respective adjacent word line, the respective adjacent word line being outside the memory cell.

8. The device as claimed in claim 1, wherein a memory cell comprises:
   one source/drain region in common with one adjacent memory cell; and
   another source/drain region in common with another adjacent memory cell.

9. A semiconductor memory device comprising:
   a plurality of first device isolation layers arranged on a semiconductor substrate at regular pitches in the row and column directions;
   a plurality of second device isolation layers arranged at positions re-moved from each of the first device isolation layers by one-half such pitch in the row and column directions;
   a plurality of word lines crossing alternately over the first and second device isolation layers in parallel in the row direction, the word lines disposed at regular intervals;
   a multiple insulation layer intervened between the word lines and the semiconductor substrate, the multiple insulation layer including a charge trap insulation layer;
   first source/drain regions formed respectively at regions defined by a pair of adjacent word lines as well as a pair of adjacent first device isolation layers crossing the pair of the adjacent word lines; and
   second source/drain regions formed respectively at regions defined by a pair of adjacent word lines as well as a pair of adjacent second device isolation layers,
   wherein the first and second source/drain regions have substantially the same surface area.

10. The device as claimed in claim 9, wherein a data storing region exists in the charge trap insulation layer adjacent to each first and second source/drain regions.

11. The device as claimed in claim 9, wherein the multiple insulation layer comprises:
   a tunnel insulation layer formed on the semiconductor substrate;
   the charge trap insulation layer formed on the tunnel insulation layer; and
   a blocking insulation layer formed on the charge trap insulation layer.

12. The device as claimed in claim 9, wherein the charge trap insulation layer includes one or more silicon nitride layers.

13. The device as claimed in claim 9, further comprising a plurality of first bit lines and a plurality of second bit lines crossing over the word lines in parallel in the column direction, the first and second bit lines alternately disposed,
   wherein the first source/drain regions in the same column are connected to a first bit line, and the second source/drain regions in the same column are connected to a second bit line.

14. A semiconductor memory device comprising:
   a plurality of device isolation layers disposed at a predetermined region of a semiconductor substrate in parallel at regular intervals in the row direction;
   a plurality of word lines crossing over the device isolation layers in the row direction, the word lines disposed in parallel at regular intervals;
   a multiple insulation layer intervened between the word lines and the semiconductor substrate, the multiple insulation layer including a charge trap insulation layer; and
   a plurality of source/drain regions formed respectively at regions defined by a pair of adjacent word lines and by a pair of adjacent device isolation layers that the pair of the adjacent word lines intersect, the source/drain regions arranged in the row and column directions,
   wherein the source/drain regions formed on the semiconductor substrate have substantially the same surface area.

15. The device as claimed in claim 14, wherein a data storing region exists in the charge trap insulation layer adjacent to each of the source/drain regions.

16. The device as claimed in claim 14, wherein the charge trap insulation layer includes one or more silicon nitride layers.

17. The device as claimed in claim 14, wherein the multiple insulation layer comprises:
   a tunnel insulation layer formed on the semiconductor substrate;
   the charge trap insulation layer formed on the tunnel insulation layer; and
   a blocking insulation layer formed on the charge trap insulation layer.

18. The device as claimed in claim 14, further comprising a plurality of parallel bit lines that cross the plurality of word lines,
   wherein two adjacent source/drain regions, each disposed at respective sides of each one of the plurality of word lines, are respectively connected to different bit lines.

19. The device as claimed in claim 18, wherein each of the plurality of parallel bit lines is connected to drain regions selected from source/drain regions of each row.

20. The device as claimed in claim 19, wherein each of the plurality of parallel bit lines is connected to one of the source/drain regions of each row, and alternately connected to source/drain regions of two adjacent rows.

* * * * *

UNITED STATES PATENT AND TRADEMARK OFFICE
CERTIFICATE OF CORRECTION

PATENT NO.         : 6,967,373 B2  
APPLICATION NO. : 10/358413  
DATED                  : November 22, 2005  
INVENTOR(S)        : Choi Page 1 of 1

Figure 2:
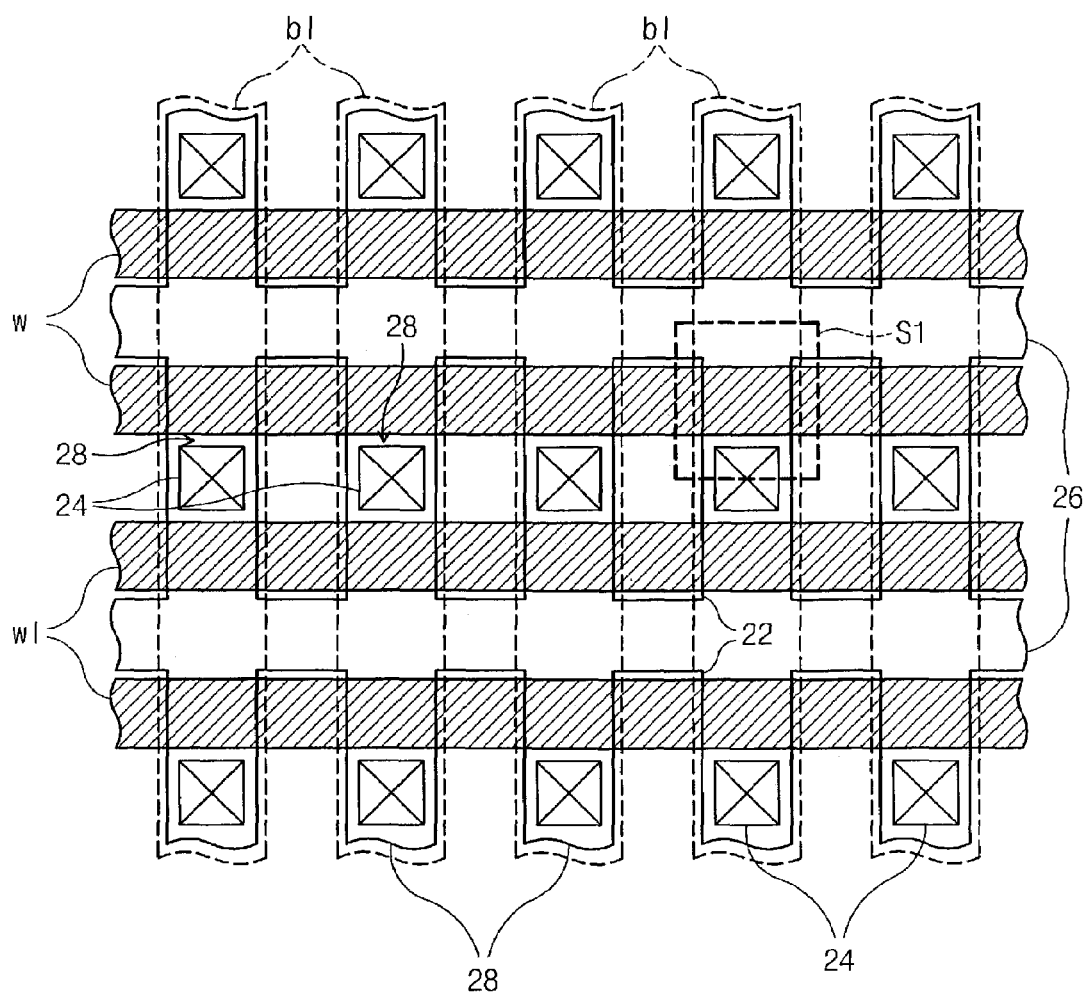
FIGS. 2 and 3 are a top plan view and an equivalent circuit diagram, respectively, illustrating a nonvolatile memory device with a conventional NOR-type cell array structure.
Figure 3:
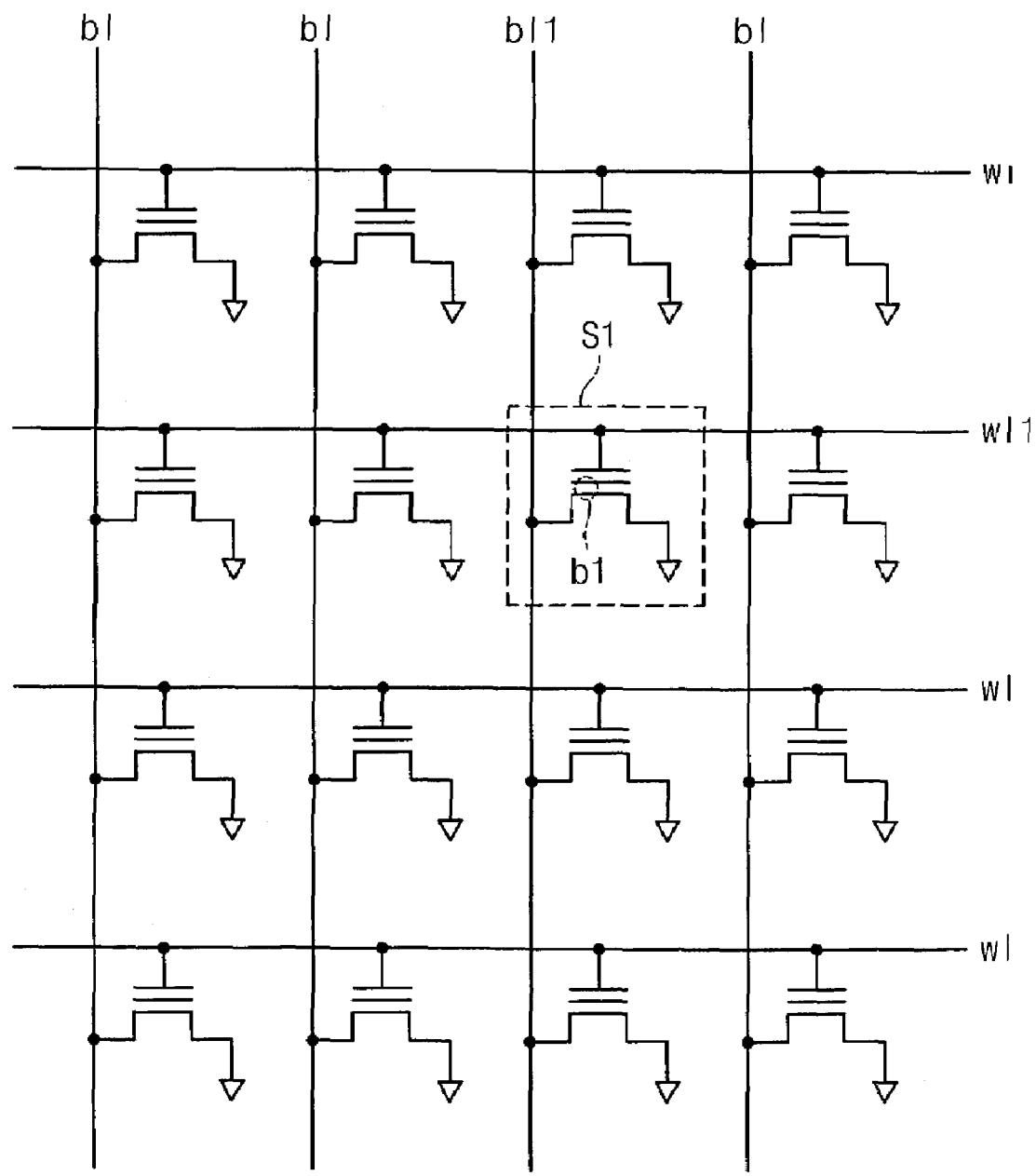
Figure 4:
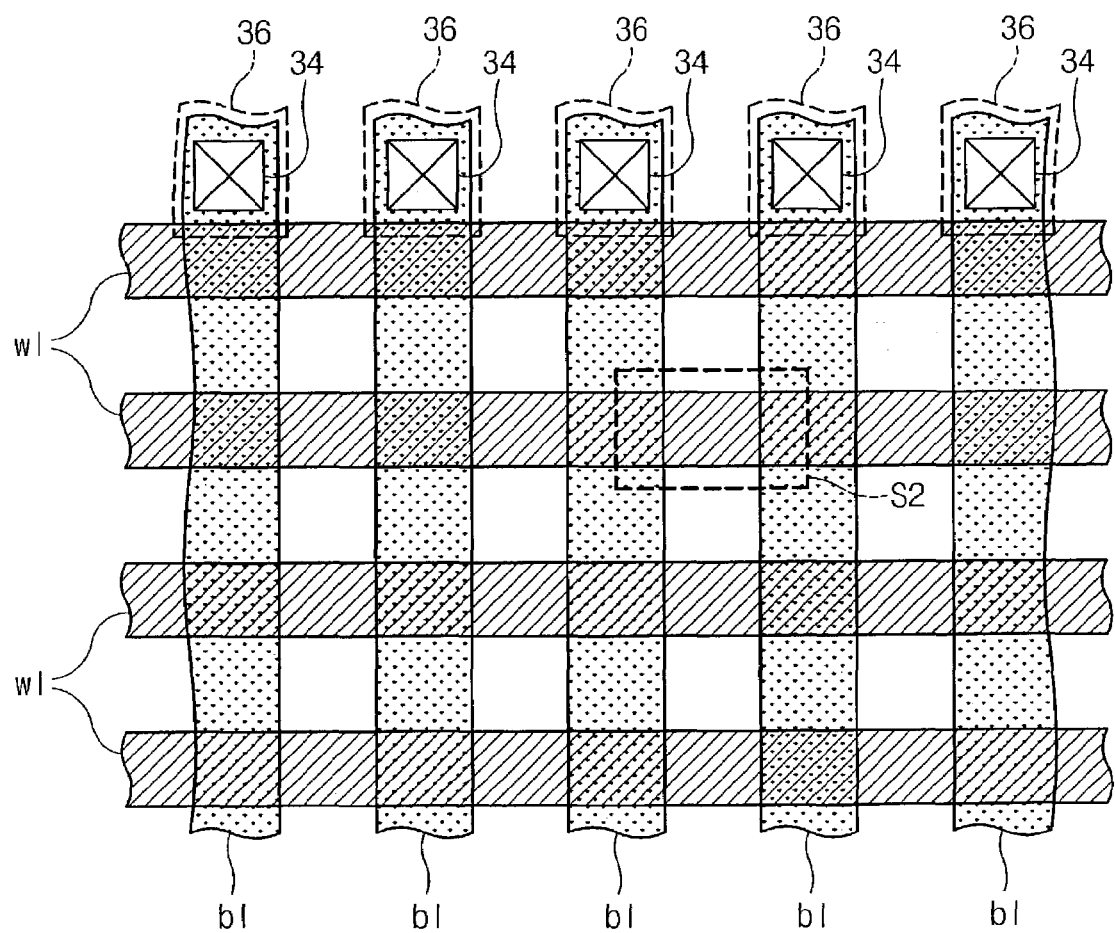
FIG. 4 is a top plan view illustrating a conventional 2-bit programmable nonvolatile memory device.
Figure 5:
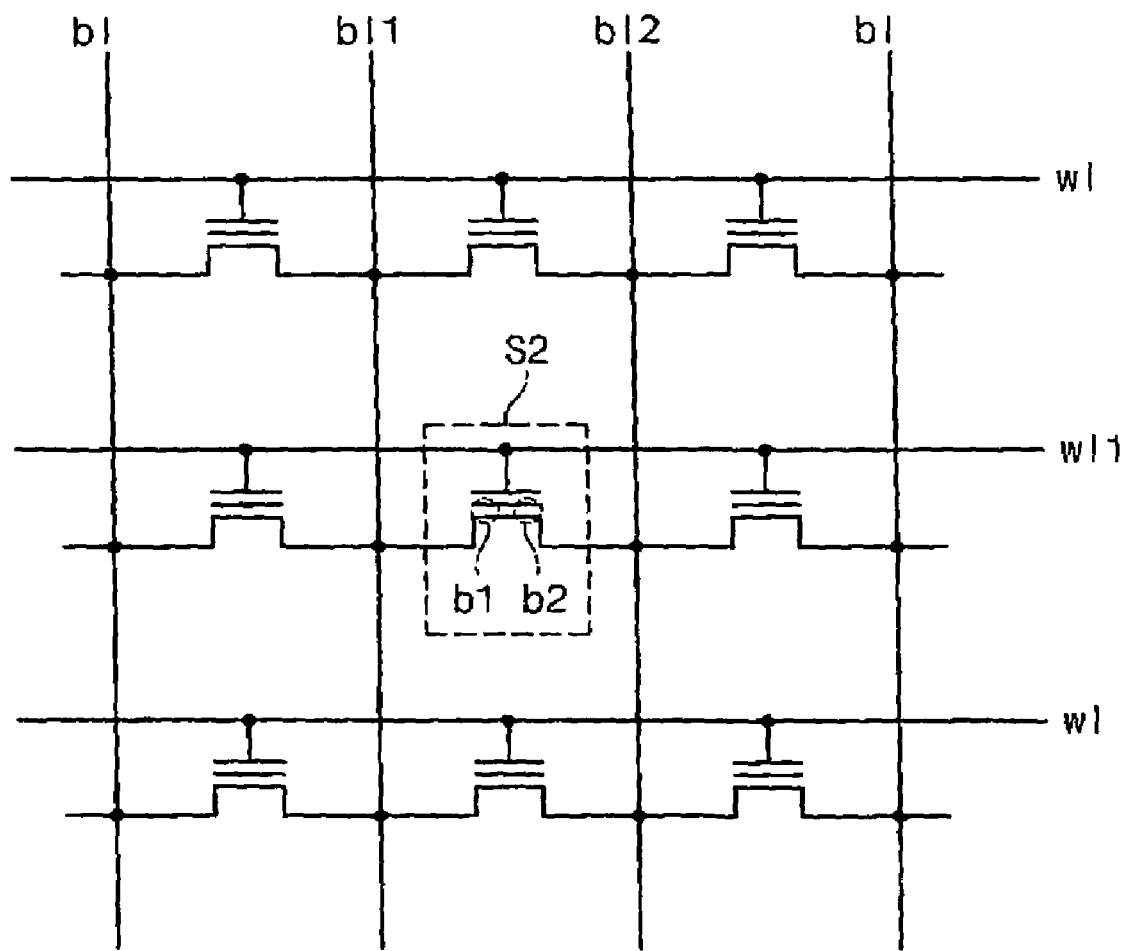
FIG. 5 is an equivalent circuit diagram of the nonvolatile memory device of FIG. 4.
Figure 6:
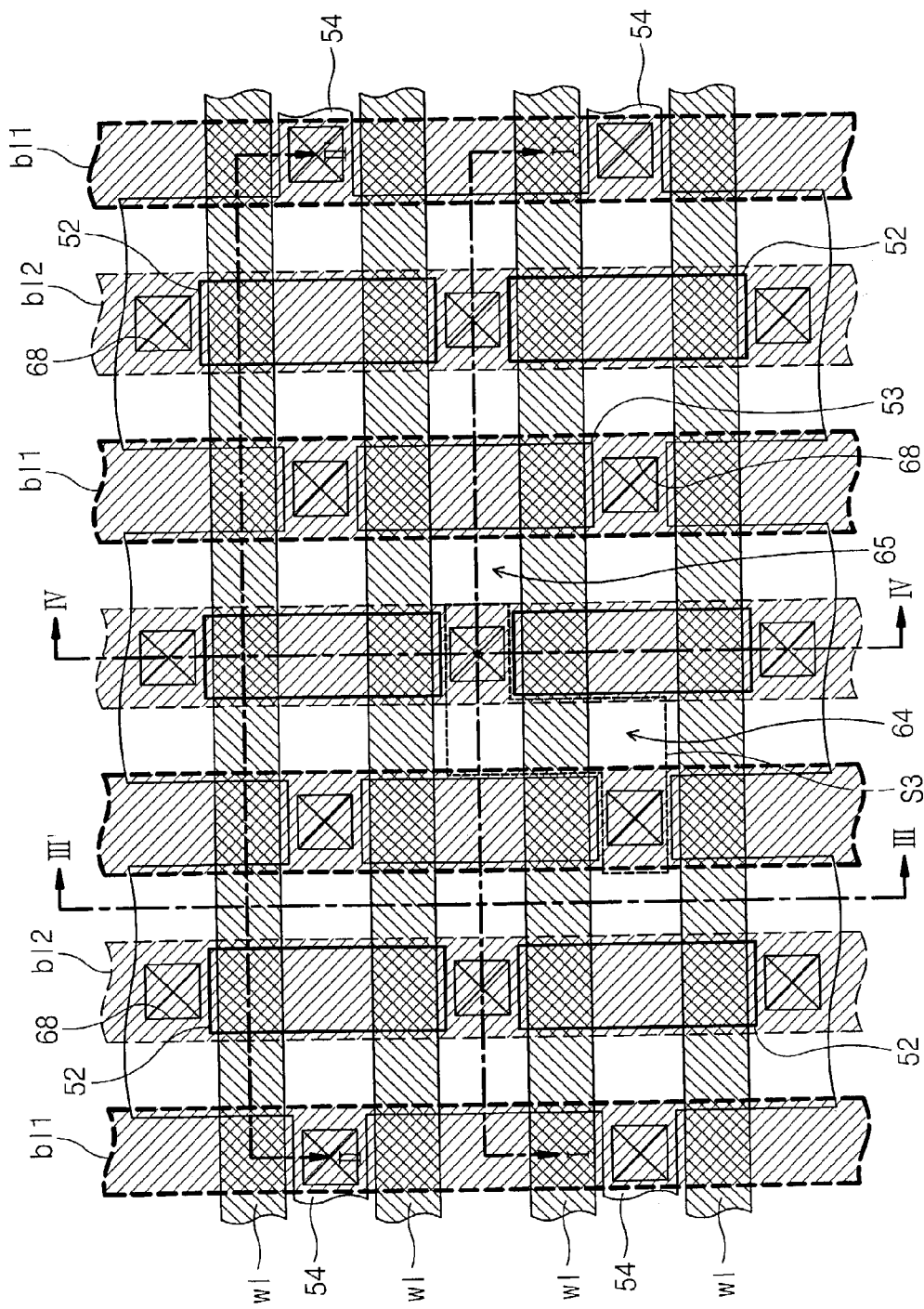
FIG. 6 is a top plan view illustrating a nonvolatile memory device according to a first preferred embodiment of the present invention.
Figure 7:
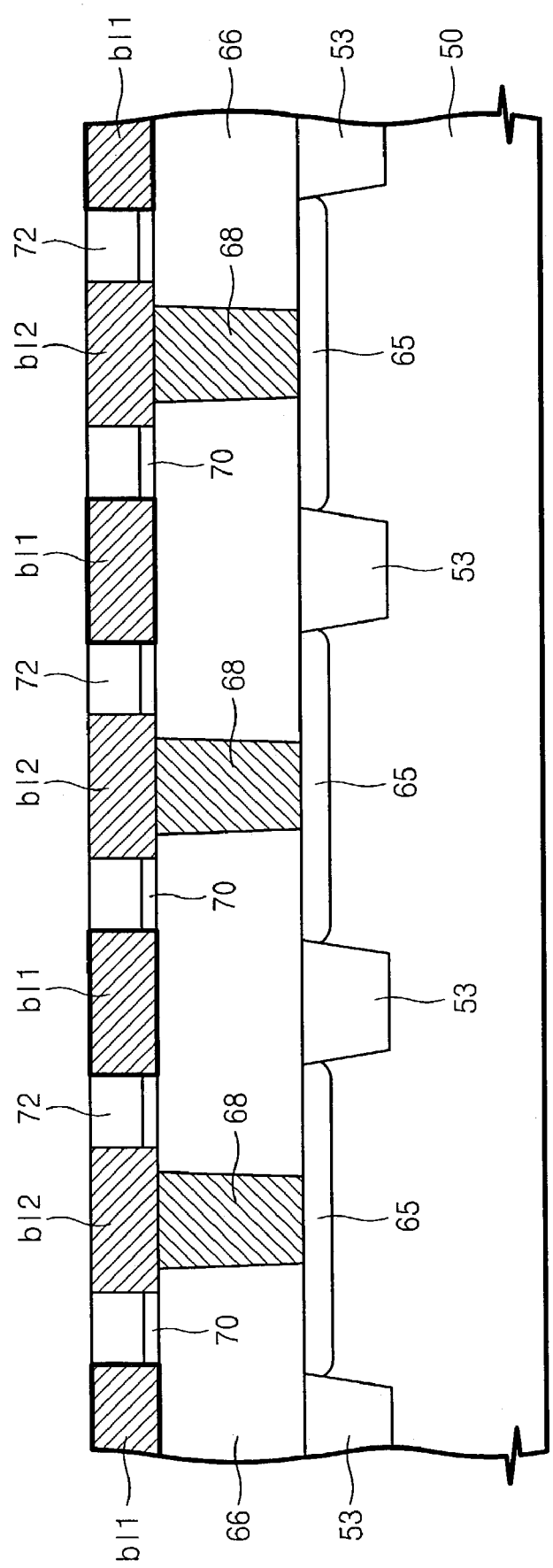
FIG. 7 is a cross-sectional view of the nonvolatile memory device according to the first preferred embodiment of the present invention, the cross-sectional view taken along the line I–I' of FIG. 6.

It is certified that error appears in the above-identified patent and that said Letters Patent is hereby corrected as shown below:

At Fig.2, left side, please replace "w" with --w1--

Title Page, item [54] and Column 1, Line 3, please replace "Fabrication" with --Fabricating--

At Column 3, Line 18, please replace "wland" with --w1 and--

At Column 11, Line 24, please replace "layer;" with --layer,--

Signed and Sealed this

Seventh Day of November, 2006

JON W. DUDAS  
*Director of the United States Patent and Trademark Office*